US012787339B2

(12) United States Patent
Clendenning et al.

(10) Patent No.: US 12,787,339 B2
(45) Date of Patent: Nov. 3, 2026

(54) TECHNOLOGIES FOR ATOMIC LAYER DEPOSITION FOR FERROELECTRIC TRANSISTORS

(71) Applicant: Intel Corporation, Santa Clara, CA (US)

(72) Inventors: Scott B. Clendenning, Portland, OR (US); Sudarat Lee, Hillsboro, OR (US); Kevin P. O'Brien, Portland, OR (US); Rachel A. Steinhardt, Beaverton, OR (US); John J. Plombon, Portland, OR (US); Arnab Sen Gupta, Hillsboro, OR (US); Charles C. Mokhtarzadeh, Portland, OR (US); Gauri Auluck, Hillsboro, OR (US); Tristan A. Tronic, Aloha, OR (US); Brandon Holybee, Portland, OR (US); Matthew V. Metz, Portland, OR (US); Dmitri Evgenievich Nikonov, Beaverton, OR (US); Ian Alexander Young, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 17/958,362

(22) Filed: Oct. 1, 2022

(65) Prior Publication Data

US 2024/0120415 A1 Apr. 11, 2024

(51) Int. Cl.
*H10D 30/47* (2025.01)
*H10D 30/01* (2025.01)
(Continued)

(52) U.S. Cl.
CPC ........... *H10D 30/47* (2025.01); *H10D 30/024* (2025.01); *H10D 30/701* (2025.01); *H10D 62/118* (2025.01); *H10P 14/69398* (2026.01)

(58) Field of Classification Search
CPC .. H10D 62/118; H10D 30/024; H10D 30/701; H10P 14/69398
See application file for complete search history.

(56) References Cited

U.S. PATENT DOCUMENTS 5,767,543 A 6/1998 Ooms et al.
5,830,270 A 11/1998 McKee et al.
(Continued)

FOREIGN PATENT DOCUMENTS

CN 105826175 A 8/2016
CN 113178490 A 7/2021
(Continued)

OTHER PUBLICATIONS

Dawber, M., et al., "Physics of thin-film ferroelectric oxides," Reviews of Modern Physics, vol. 77, No. 4; Oct. 2005, pp. 1083-1130; 48 pages.

(Continued)

*Primary Examiner* — Mark V Prenty
(74) *Attorney, Agent, or Firm* — Alliance IP, LLC

(57) ABSTRACT

Technologies for a field effect transistor (FET) with a ferroelectric gate dielectric are disclosed. In an illustrative embodiment, a perovskite stack is grown on a buffer layer as part of manufacturing a transistor. The perovskite stack includes one or more doped semiconductor layers alternating with other lattice-matched layers. Growing the doped semiconductor layers on lattice-matched layers can improve the quality of the doped semiconductor layers. The lattice-matched layers can be etched away, leaving the doped semiconductor layers as fins for a ribbon FET. A ferroelectric layer can be conformally grown on the fins, creating a high-quality ferroelectric layer above and below the fins. A gate can then be grown on the ferroelectric layer.

24 Claims, 18 Drawing Sheets

(51) Int. Cl.

| | |
|---|---|
| ***H10D 30/69*** | (2025.01) |
| ***H10D 62/10*** | (2025.01) |
| ***H10P 14/692*** | (2026.01) |

(56) References Cited

U.S. PATENT DOCUMENTS

| | | | | |
|---|---|---|---|---|
| 6,262,462 | B1 | 7/2001 | Marshall et al. | |
| 9,853,150 | B1 | 12/2017 | Colinge et al. | |
| 10,903,317 | B1 | 1/2021 | Frougier et al. | |
| 12,219,783 | B2 * | 2/2025 | Karda | H10B 63/84 |
| 12,652,834 | B2 | 6/2026 | Yoo et al. | |
| 2010/0001324 | A1 | 1/2010 | Furukawa et al. | |
| 2017/0352539 | A1 | 12/2017 | Yang et al. | |
| 2018/0374933 | A1 | 12/2018 | Cheng et al. | |
| 2019/0196830 | A1 | 6/2019 | Lilak et al. | |
| 2019/0245130 | A1 | 8/2019 | Jha et al. | |
| 2020/0328287 | A1 | 10/2020 | Chen et al. | |
| 2020/0357911 | A1 | 11/2020 | Frougier et al. | |
| 2021/0151445 | A1 | 5/2021 | Wagner et al. | |
| 2021/0257452 | A1 | 8/2021 | Trivedi et al. | |
| 2021/0391471 | A1 | 12/2021 | Vellianitis | |
| 2022/0165731 | A1 | 5/2022 | Huang et al. | |
| 2023/0290834 | A1 | 9/2023 | Xie et al. | |

FOREIGN PATENT DOCUMENTS

| | | | |
|---|---|---|---|
| CN | 113178491 | A | 7/2021 |
| JP | 2004179617 | A | 6/2004 |

OTHER PUBLICATIONS

Dingle, R., et al., "Electron mobilities in modulation-doped semiconductor heterojunction superlattices," Appl. Phys. Lett. 33(7), Oct. 1, 1978; pp. 665-667; 3 pages.

Eom, Kitae, et al., "Oxide Two-Dimensional Electron Gas with High Mobility at Room-Temperature," Advanced Science, 2022, vol. 2105652; 8 pages.

Hong, Xia, "Emerging ferroelectric transistors with nanoscale channel materials: the possibilities, the limitations," Journal of Physics: Condensed Matter; 2016; IP Publishing Ltd, United Kingdom; 33 pages.

Hwang, Y. H., et al., "Emergent phenomena at oxide interfaces," Nature Materials; vol. 11; Feb. 2012; pp. 103-113; 11 pages.

M. Holtz, et al., "A Room-Temperature Magnetoelectric Multiferroic made by Thin Film Alchemy," as presented at AVS 66th International Symposium and Exhibition, Oct. 21, 2019 (34 pgs).

Manipatruni, Sasikanth, et al., "Scalable energy-efficient magnetoelectric spin-orbit logic," Springer Nature Limited, 2018; 9 pages.

Nakagawa, Naoyuki, et al., "Why some interfaces cannot be sharp," nature materials vol. Mar. 5, 2006; pp. 204-209; 6 pages.

Prakash, Abhinav, et al., "Separating Electrons and Donors in BaSnO3 via Band Engineering," Nano Letters, 2019; pp. 8920-8927; 8 pages.

R. Steinhardt, et al., "Breaking Symmetries to Create a Robust Room-Temperature Ferrimagnetic Ferroelectric in LuFeO3/CoFe2O4 Superlattices," as presented at Materials Research Society Symposium EL03—Multiferroics and Magnetoelectrics, Dec. 3, 2019 (40 pgs).

Ramesh, R., "Complex functional oxide heterostructures," Current Science, vol. 105, No. 8, Oct. 25, 2013, pp. 1107-1144; 8 pages.

S. Dünkel et al., "A FeFET based super-low-power ultra-fast embedded NVM technology for 22nm FDSOI and beyond," 2017 IEEE International Electron Devices Meeting (IEDM), 2017, pp. 19.7.1-19.7.4, doi: 10.1109/IEDM.2017.8268425; 4 pages.

Tokura, Yoshinori, "Correlated-Electron Physics in Transition-Metal Oxides," Physics Today, Jul. 2003; pp. 50-55; 6 pages.

U.S. Appl. No. 17/958,362, filed Oct. 1, 2022.

Yu, P., "Emergent phenomena at multiferroic heterointerfaces," Philosophical Transactions of The Royal Society, 2012; pp. 4856-4871; 16 pages.

USPTO Non-Final Office Action issued in U.S. Appl. No. 18/091,676, mailed Feb. 5, 2026, 9 pages.

Cheng, et al., "Nanoscale etching of perovskite oxides for field effect transistor applications," Journal of Vacuum Science, American Institute of Physics; Melville, NY; vol. 38, No. 1; Dec. 18, 2019; 7 pages.

EPO European Extended Search Report in EP Application Serial No. 23166327.9 mailed on Sep. 25, 2023, 12 pages.

J. Cheng et al., "High-Current Perovskite Oxide BaTiO3/BaSnO3 Heterostructure Field Effect Transistors," in IEEE Electron Device Letters, vol. 41, No. 4, pp. 621-624, Apr. 2020, doi: 10.1109/LED.2020.2976456.

Mathews, S., et al., "Ferroelectric Field Effect Transistor Based on Epitaxial Perovskite Heterostructures," Science, [Online] vol. 276, No. 5310; Apr. 11, 1997, pp. 238-240; 4 pages.

U.S. Appl. No. 17/557,119, filed Dec. 21, 2021.

Grunebohm, Anna, et al., "Tuning the caloric response of BaTiO3 by tensile epitaxial strain," Europhysics Letters, vol. 115, No. 4; 6 pages.

Lee, Daesu, et al., "Giat flexoelectric effect through interfacial strain relaxation," Philosophical Transactions of The Royal Society A; 2012; pp. 4944-4957; doi:10.1098/rsta.2012.0200; 14 pages.

Schlom, Darrell G., et al., "Elastic strain engineering of ferroic oxides," Mrs Bulletin; vol. 39, pp. 118-130; Feb. 2014; 13 pages.

U.S. Appl. No. 17/734,372, filed May 5, 2022.

U.S. Appl. No. 17/956,296, filed Sep. 29, 2022.

U.S. Appl. No. 17/958,094, filed Sep. 30, 2022.

Amrouch et al., Negative Capacitance Transistor to Address the Fundamental Limitations in Technology Scaling: Processor Performance, in IEEE Access, vol. 6, pp. 52754-52765, 2018, doi: 10.1109/ACCESS.2018.2870916 (Year: 2018); 12 pages.

Cheng et al., Electron transport of perovskite oxide BaSnO3 on ( 110) DyScO3 substrate with channel-recess for ferroelectric field effect transistors. Appl. Phys. Lett. Jan. 25, 2021; 118 (4): 042105. https://doi. org/10.1063/5.0022550 (Year: 2021).

Cheng et al., High-Current Perovskite Oxide BaTiO3/BaSnO3 Heterostructure Field Effect Transistors, in IEEE Electron Device Letters, vol. 41, No. 4, pp. 621-624, Apr. 2020, doi: 10.1109/LED.2020.2976456 (Year: 2020); 4 pages.

Cheng et al., Nanoscale etching of perovskite oxides for field effect transistor applications. J. Vac. Sci. Technol. B Jan. 1, 2020; 38 (1): 012201. https://doi.org/10.1116/1.5122667 (Year: 2019).

Omar Faruk Sharon, Novel Channel Materials for Field-Effect Devices: Barium Stannate and Cadmium Arsenide, Thesis Dissertation, 2021 (Year: 2021); 233 pages.

USPTO Non-Final Office Action issued in U.S. Appl. No. 17/956,296, mailed Feb. 24, 2026; 15 pages.

Yue et al., Depletion Mode MOSFET Using La-Doped BaSnO3 as a Channel Material, ACS Applied Materials & Interfaces 2018 10 (25), 21061-21065 DOI: 10.1021/acsami.8b05229 (Year: 2018); 5 pages.

U.S. Appl. No. 18/091,676, filed Dec. 30, 2022.

U.S. Appl. No. 18/091,714, filed Dec. 30, 2022.

USPTO Non-Final Office Action in U.S. Appl. No. 17/734,372 mailed on Jun. 18, 2025 (7 pages).

EPO Communication Pursuant to Article 94(3) EPC in EP Application Serial No. 23166327.9 mailed on Jul. 14, 2025, 6 pages.

Jurczak M. et al: "Review of FINFET technology", SOI Conference, 2009 IEEE International, Oct. 1, 2009 (Oct. 1, 2009), pp. 1-4, XP093294223, Piscataway, NJ, USA Doi: 10.1109/SOI.2009.5318794; 4 pages.

USPTO Non-Final Office Action issued in U.S. Appl. No. 17/958,094, mailed Jun. 10, 2026, 15 pages.

USPTO Notice of Allowance issued in U.S. Appl. No. 18/091,676, mailed Jul. 24, 2026; 9 pages.

* cited by examiner

TECHNOLOGIES FOR ATOMIC LAYER DEPOSITION FOR FERROELECTRIC TRANSISTORS

BACKGROUND

Transistors are ubiquitous devices present in virtually all electronic devices. As the density of transistors continues to increase, the power dissipated by the transistors needs to be addressed. The power dissipation of a transistor can be reduced in several ways, such as reducing leakage current and reducing the threshold voltage of the transistor.

A typical transistor can maintain its state when a voltage is maintained at a gate electrode. However, a ferroelectric field-effect transistor (FEFET) can maintain its state based on a state of a ferroelectric layer in the transistor. FEFETs typically have a relatively high threshold voltage and a corresponding relatively high leakage current.

DETAILED DESCRIPTION

Figure 1:
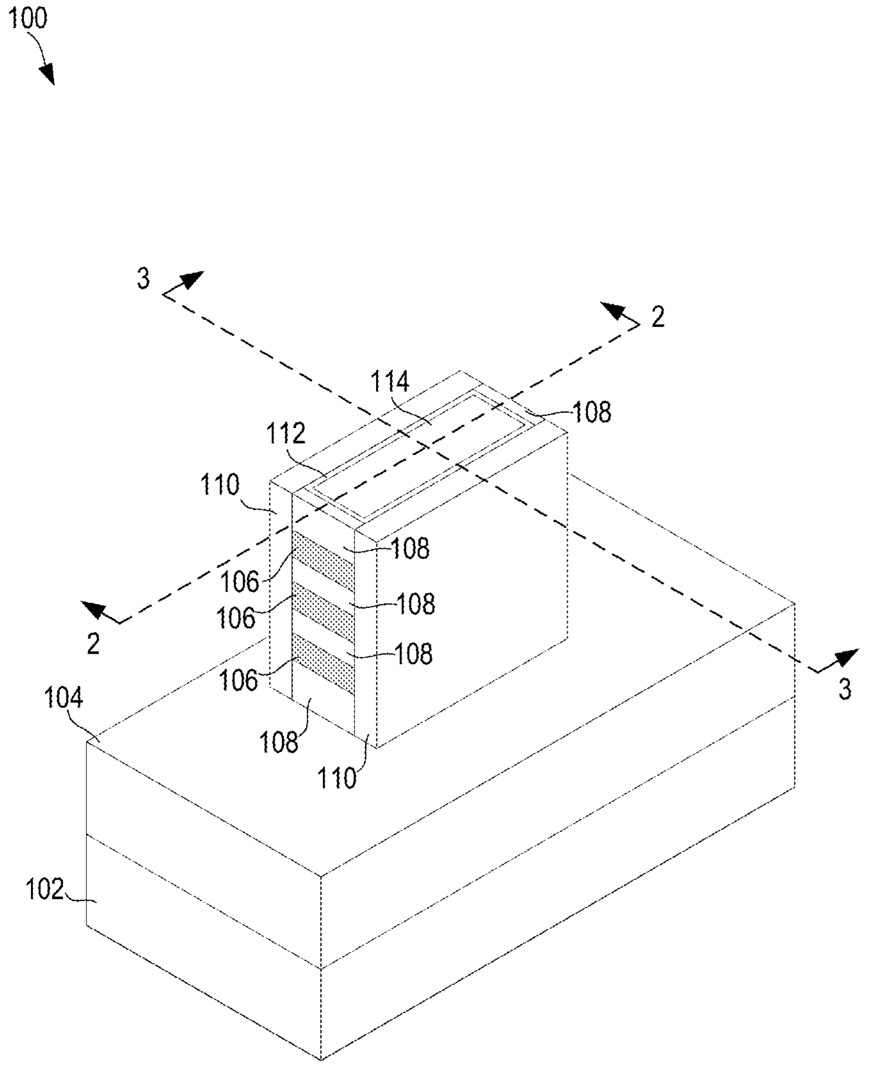
FIG. 1 is an isometric view of a ribbon field-effect transistor (FET).

In one embodiment disclosed herein, as described in more detail below, the channel of a field-effect transistor (FET) is a perovskite such as barium stannate ($BaSnO_3$), at least part of which is doped with a dopant such as lanthanum. A ribbon FET may have several fins arranged in a vertical stack. In order to create high-quality barium stannate fins, a stack of layers of barium stannate interleaved with sacrificial layers of another perovskite are deposited on a substrate. The sacrificial layers can be partially etched away while leaving more of the doped barium stannate, creating high-quality fins of doped barium stannate. Other components of the ribbon FET, such as a dielectric layer that is ferroelectric and a gate, can be deposited on the fins, such as through epitaxial atomic layer deposition. Additional embodiments with different materials for the channel and/or the spacer layers are described below. As used herein, a dielectric material includes a linear dielectric material, a paraelectric material, or a ferroelectric material.

In the following description, specific details are set forth, but embodiments of the technologies described herein may be practiced without these specific details. Well-known circuits, structures, and techniques have not been shown in detail to avoid obscuring an understanding of this description. Phrases such as “an embodiment,” “various embodiments,” “some embodiments,” and the like may include features, structures, or characteristics, but not every embodiment necessarily includes the particular features, structures, or characteristics.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Some embodiments may have some, all, or none of the features described for other embodiments. “First,” “second,” “third,” and the like describe a common object and indicate different instances of like objects being referred to. Such adjectives do not imply objects so described must be in a given sequence, either temporally or spatially, in ranking, or any other manner. “Connected” may indicate elements are in direct physical or electrical contact, and “coupled” may indicate elements co-operate or interact, but they may or may not be in direct physical or electrical contact. Furthermore, the terms “comprising,” “including,” “having,” and the like, as used with respect to embodiments of the present disclosure, are synonymous. Terms modified by the word “substantially” include arrangements, orientations, spacings, or positions that vary slightly from the meaning of the unmodified term. For example, a substrate assembly feature, such as a through width, that is described as having substantially a listed dimension can vary within a few percent of the listed dimension.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

References are made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

Figure 2:
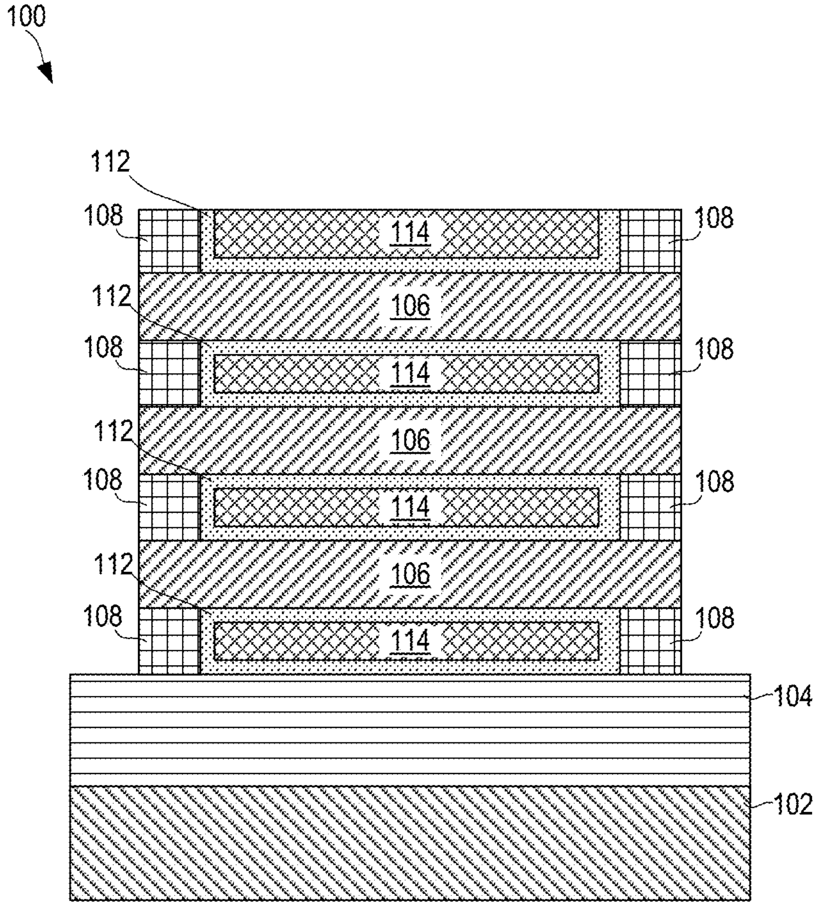
FIG. 2 is a cross-sectional side view of one embodiment of the transistor of FIG. 1.
Figure 4:
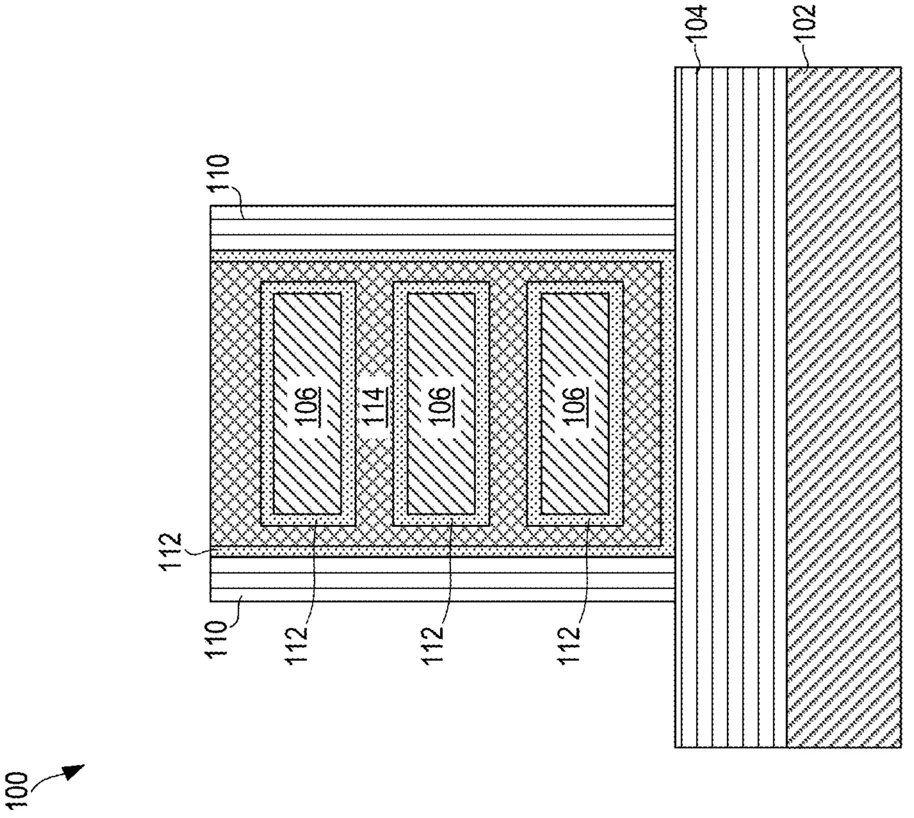
FIG. 4 is a cross-sectional side view of one embodiment of the transistor of FIG. 1.
Figure 3:
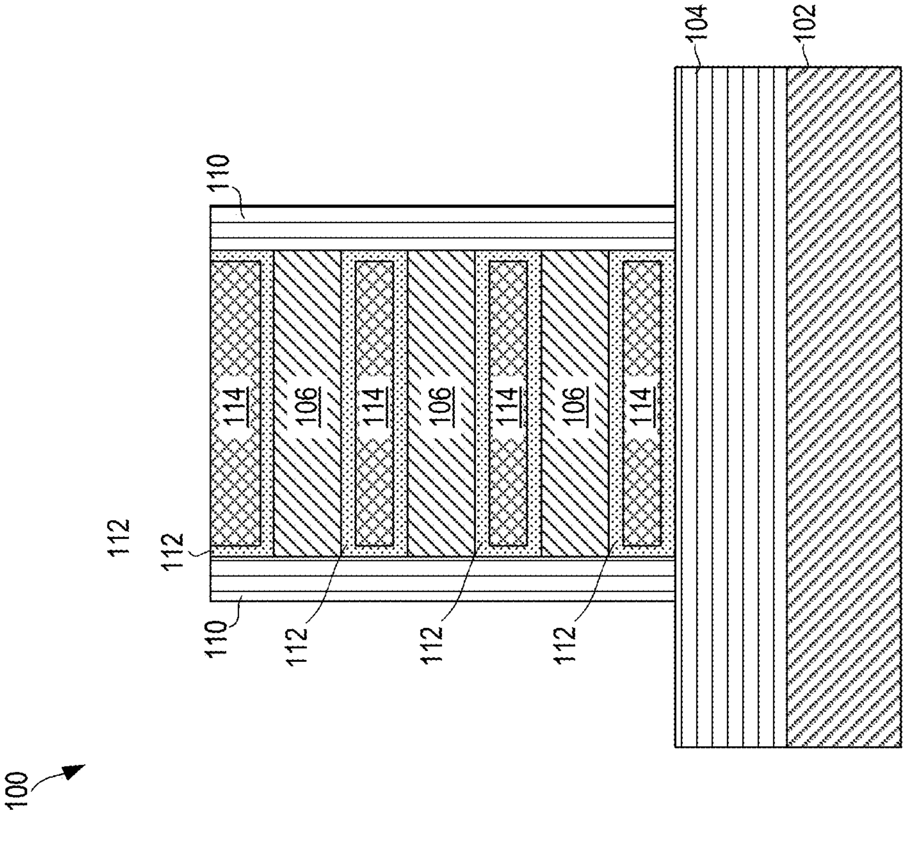
FIG. 3 is a cross-sectional side view of one embodiment of the transistor of FIG. 1.

Referring now to FIGS. 1-4, in one embodiment, FIG. 1 shows a perspective view of a ribbon FET 100, FIG. 2 shows a cross-sectional view of the ribbon FET 100 taken from view 2 labeled in FIG. 1, FIG. 3 shows a cross-sectional view of one embodiment of the ribbon FET 100 taken from view 3 labeled in FIG. 1, and FIG. 4 shows a cross-sectional view of another embodiment of the ribbon FET 100 taken from the same view as FIG. 3. In some embodiments, the ribbon FET 100 may also be referred to as a gate-all-around transistor, a nanowire transistor, a nanosheet transistor, etc.

The ribbon FET 100 is supported by a substrate 102 and a buffer layer 104. The ribbon FET 100 has one or more channel fins 106. Dielectric spacers 108 are interleaved with the channel fins 106 at either end of the channel fins 106. The dielectric spacers 108 both support the channel fins 106 and provide a surface for atomic layer deposition, as described below in more detail in regard to FIG. 5. Dielectric isolation layers 110 surround the channel fins 106 and other structures of the transistor 100. A ferroelectric layer 112 surrounds the channel fins 106 inside the region bounded by the dielectric spacers 108 and the dielectric isolation layers 110. In the illustrative embodiment, the ferroelectric layer 112 is conformal to the interior surfaces of the dielectric spacers 108, the dielectric isolation layers, and the channel fins 106. The gate 114 fills the rest of the volume bounded by the dielectric isolation layers 110 and the dielectric spacers 108.

In the illustrative embodiment and as described below in more detail in regard to FIG. 5, the channel fins 106 are made of a doped semiconductor, and the dielectric spacers 108 are a low-k material such as, e.g., SiOCN deposited by atomic layer deposition or chemical vapor deposition and a subsequent anisotropic vertical etch. In other embodiments, the dielectric spacers 108 may be made from a material with a similar lattice constant as the channel fins 106 to facilitate growth of high-quality crystals of the doped semiconductor of the channel fins 106.

In use, a voltage can be applied to the gate 114, which causes an electric field to be applied to the ferroelectric layer 112 and to the channel 106. In the illustrative embodiment, if the applied voltage causes an electric field above a coercive field, the direction of the spontaneous polarization of the ferroelectric material can switch. The electric displacement of the ferroelectric material is the spontaneous polarization of the ferroelectric when no electric field is applied by the gate 114. Under the applied field from the voltage of the gate 114, the electric displacement of the ferroelectric material increases. As a result, the electric displacement applied to the channel 106 is affected by the polarization state of the ferroelectric material of the ferroelectric layer 112, and, therefore, the current through the channel 106 is affected by the polarization state of the ferroelectric material of the ferroelectric layer 112. This property can be used to facilitate low-threshold switching, single transistor memory, and compute-in-memory.

The substrate 102 supports the buffer layer 104 and the rest of the transistor 100. In the illustrative embodiment, the substrate 102 is silicon. In other embodiments, the substrate 102 may be, e.g., silicon oxide, gallium nitride, a perovskite, strontium titanium oxide, etc.

A perovskite material is any crystalline material with a crystal structure similar to calcium titanate ($CaTiO_3$), typically with the chemical formula of $ABX_3$, where A is one element, B is a second element, and X is a third element. In some cases, some of one (or more) of element A, B, or X in a perovskite material may be replaced by a different element. For example, in one embodiment, $Pb(Zr_xTi_{1-x})O_3$ (i.e., lead zirconate titanate or PZT) can have both zirconium and titanium as element B, with a varying amount of each depending on the value of x. A perovskite material may have various cation pairings, such as $A^{+}B^{2+}X^{-}_{3}$, $A^{2+}B^{4+}X^{2-}$, $A^{3+}B^{3+}X^{2-}_{3}$ or $A^{+}B^{5+}X^{2-}_{3}$.

The buffer layer 104 may be any suitable material on which the spacers 108, the sacrificial layers 704, and/or the dielectric layer 112 may be grown. The buffer layer 104 may be lattice matched to the lattice parameter of the spacers 108 and/or the channel 106. In the illustrative embodiment, the buffer layer 104 is strontium titanium oxide ($SrTiO_3$ or STO or strontium titanate). In some embodiments, the buffer layer 104 may be referred to as a substrate.

The channel 106 may be made from any suitable material, such as a doped perovskite. In the illustrative example, the channel 106 is made from lanthanum-doped barium stannate (La—$BaSnO_3$). In other embodiments, the channel 106 may be made from other materials, such as lanthanum-doped $SrSnO_3$ or lanthanum-doped $(BaSr)SnO_3$. In some embodiments, additionally or alternatively, the channel 106 may be doped with a different element, such as Nd, Ce, Cs, Y, V, K, Co, etc.

In some embodiments, the fins 106 may extend past the spacers 108. The part of the fins 106 that extend between or past the spacers 108 may be doped differently than the central channel region of the fins 106, forming source and drain regions. The source region and drain region may be doped relatively strongly, and the channel region may be doped relatively lightly. In the illustrative embodiment, the transistor 100 is symmetric, and there is no functional distinction between the source region and the drain region. The fins 106 may have any suitable dimensions, such as a thickness or width of, e.g., 0.5-20 nanometers and a length of, e.g., 2-50 nanometers. The transistor may include any suitable number of fins 106, such as 1-5. An electrode may be disposed at either end of the fins 106 (not shown in the figures).

The spacers 108 may be made from any material with a lattice parameter that is close to that of the channel 106, such as a lattice parameter within 3% of the channel 106. In the illustrative embodiment, the channel 106 may be lanthanum-doped barium stannate, and the spacers 108 may be made from, e.g., relatively lightly doped barium stannate ($BaSnO_3$), $SrTiO_3$, $SrRuO_3$, $(SrBa)RuO_3$, $ReScO_3$ (where Re may be Dy, Tb, Gd, Eu, Sm, Nd, Pr, Ce, or La), $LaLuO_3$, $La(LuSc)O_3$, $BaHfO_3$, $BaZrO_3$, $LaAlO_3$, $LaCoO_3$, $SrSnO_3$, $Ba2ScNbO_6$, $SrZrO_3$, $SrHfO_3$, $LaInO_3$, MgO, $(Sr,Ba)SnO_3$, etc.

The dielectric isolation layers 110 may be made of any suitable material, such as silicon nitride. In some embodiments, the dielectric isolation layers 110 may be used to provide a boundary on which to grow the ferroelectric layer 112 and the gate 114. The dielectric isolation layers 110 may have any suitable dimension, such as a length along the buffer layer 104 of, e.g., 2-50 nanometers, a height of, e.g., 5-50 nanometers, and a width of, e.g., 2-30 nanometers.

The ferroelectric layer 112 may be any suitable ferroelectric, such as a perovskite ferroelectric. In the illustrative embodiment, the ferroelectric layer 112 may be barium titanate ($BaTiO_3$ or BTO) or bismuth ferrite ($BiFeO_3$ or BFO). In other embodiments, the ferroelectric layer 112 may be a different material, such as lead zirconate titanate ($Pb(Zr_xTi_{1-x})O_3$ or PZT), lead niobate zirconate titanate ($(Pb_{1-x}Nb_x)(Zr_{1-y}Ti_y)O_3$ or PNZT), lead lanthanum zirconate titanate ($(Pb_{1-x}La_x)(Zr_{1-y}Ti_y)O_3$ or PLZT), lanthanum bismuth ferrite ($LaxBi_{1-x}FeO_3$ or LaBFO), bismuth iron cobaltate ($BiFe_{1-x}Co_xO_3$), lithium or potassium niobate ($LiNbO_3$ or $KNbO_3$), $CaNbTi_2O_6$, $Pb_2BiNbO_6$, $Ca_3Nb_2N_2O_5$, $Bi_4Ti_3O_{12}$, $Ba(Hf,Ti)O_3$, $(Ba,Ca)(ZrTi)O_3$, $GdFeO_3$, $(Gd,La)FeO_3$, etc., and combinations thereof. In some embodiments, the layer 112 may be a dielectric layer with two or more sublayers, such as a linear dielectric layer and a ferroelectric layer. The linear dielectric layer may facilitate lattice matching for the ferroelectric and/or may reduce leakage current between the channel 106 and the gate 114.

In the illustrative embodiment, the various elements or dopants of the ferroelectric layer 112 are uniformly distributed throughout the ferroelectric layer 112. In other embodiments, dopants or other elements may have a concentration gradient, which may improve device performance.

The ferroelectric layer 112 may have any suitable coercive field, such as 50-500 kV/cm. The ferroelectric layer 112 may be any suitable thickness. The ferroelectric layer 112 may have any suitable thickness, such as a thickness of about 0.5-25 nanometers.

The threshold voltage of the transistor 100 depends on the ferroelectric layer 112 material as well as the channel 106 thickness and doping concentration. The threshold voltage of the transistor 100 may be any suitable value, such as 0.2-5 volts, depending on the materials used.

In some embodiments, the polarization of the ferroelectric of the ferroelectric layer 112 switches all at once in a few picoseconds. In other embodiments, the ferroelectric of the ferroelectric layer 112 may have multiple domains that may switch at different applied electric fields (and, therefore, at different times). In such embodiments, the ferroelectric of the ferroelectric layer 112 may have multiple stable states that can be set by applying a particular voltage to the gate 114. Such a transistor 100 can act as a multi-level memory or like an analog memory.

The illustrative gate 114 is a metallic perovskite or other metal, such as ruthenium, ruthenium oxide, iridium, iridium oxide, platinum, palladium, molybdenum, molybdenum oxide, rhodium, rhenium, tungsten, $LaNiO_3$, $LaRuO_3$, $SrVO_3$, $SrCoO_3$, $SrMoO_3$, $SrRuO_3$, lanthanum strontium manganite ($La_{1-x}Sr_xMnO_3$ or LSMO), lanthanum strontium cobalt oxide ($La_{1-x}Sr_xCoO_3$ or LSCO), $SrFeO_3$, $ReO_3$ (where Re may be Dy, Tb, Gd, Eu, Sm, Nd, Pr, Ce, or La), $CaRuO_3$, $SrNbO_3$, etc. In some embodiments, the work function of the gate 114 is selected to shift the coercive voltage across the ferroelectric layer 112.

Two illustrative embodiments of the transistor 100 are shown in FIGS. 3 and 4. In FIG. 3, the transistor has a top and bottom gate design, with the gate 114 being positioned on top of and on bottom of each channel fin 106. In another embodiment, as shown in FIG. 4, the channel fins 106 do not extend all the way to the dielectric isolation layers 110, allowing the gate 114 to be all around the channel fins 106 in the cross-section shown in FIG. 4. The channel fins 106 may be, e.g., 2-30 nanometers from the dielectric isolation layers 110.

Figure 5:
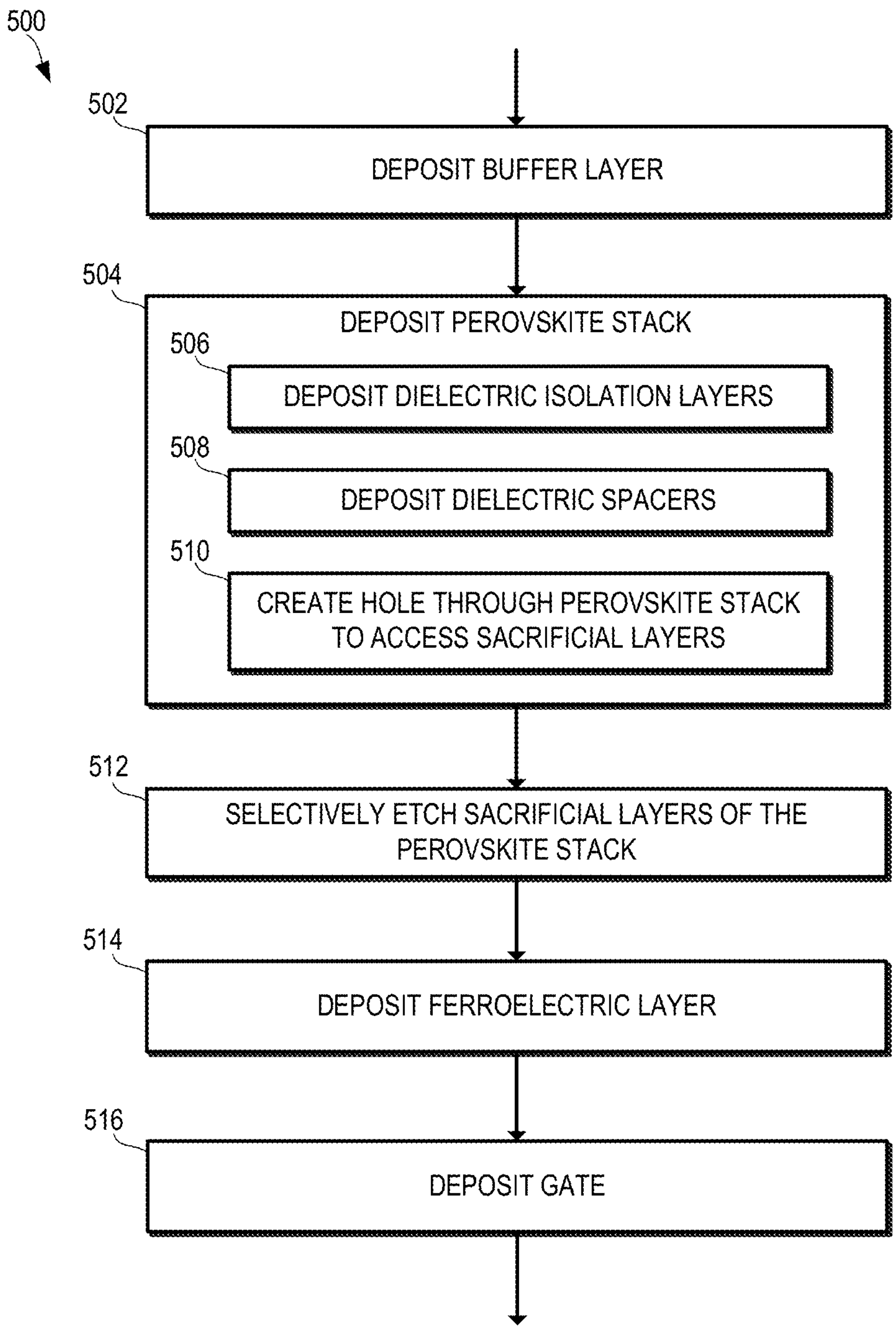
FIG. 5 is a simplified flow diagram of at least one embodiment of a method for creating a ribbon FET.

Referring now to FIG. 5, in one embodiment, a flowchart for a method 500 for creating a transistor (such as transistor 100) is shown. The method 500 may be executed by a technician and/or by one or more automated machines. In some embodiments, one or more machines may be programmed to do some or all of the steps of the method 500. Such a machine may include, e.g., a memory, a processor, data storage, etc. The memory and/or data storage may store instructions that, when executed by the machine, causes the machine to perform some or all of the steps of the method 500. The method 500 may use any suitable set of techniques that are used in semiconductor processing, such as chemical vapor deposition, atomic layer deposition, physical vapor deposition, molecular beam epitaxy, pulsed laser deposition, layer transfer, photolithography, ion implantation, dry etching, wet etching, thermal treatments, etc. FIGS. 6-18 show various stages of the method 500 as it is used to create a transistor. FIGS. 7, 10, 13, and 16 show various stages of the method 500 from the same perspective as FIG. 2. FIGS. 8, 9, 11, 12, 14, 15, 17, and 18 show various stages of the method 500 from the same perspective as FIGS. 3 and 4. FIGS. 8, 11, 14, and 17 various stages of the method 500 as it forms a top and bottom gate transistor 100, as shown in FIG. 3. FIGS. 9, 12, 15, and 18 various stages of the method 500 as it forms a gate-all-around transistor 100, as shown in FIG. 4.

Figure 6:
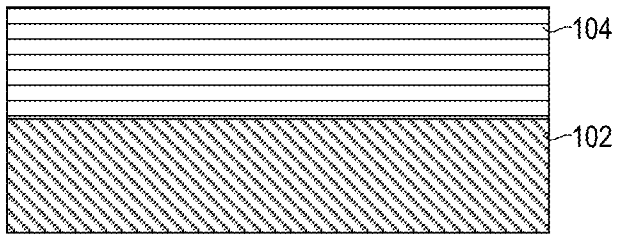
FIG. 6 is a cross-sectional side view at one step of manufacturing the transistor of FIG. 1.

The method 500 begins in block 502, in which a buffer layer 104 is deposited on a substrate 102, as shown in FIG. 6. The buffer layer 104 may be deposited in any suitable manner, such as chemical vapor deposition, atomic layer deposition, physical vapor deposition, molecular beam epitaxy, pulsed laser deposition, etc. In some embodiments, the buffer layer 104 is deposited using layer transfer.

Figure 7:
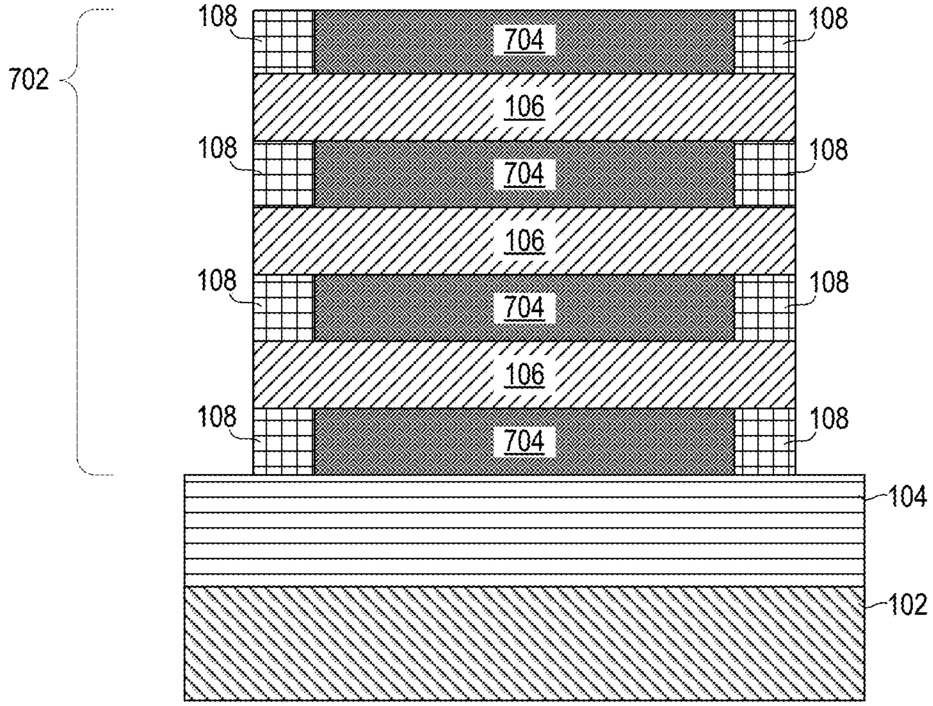
FIG. 7 is a cross-sectional side view at one step of manufacturing the transistor of FIG. 1.
Figure 8:
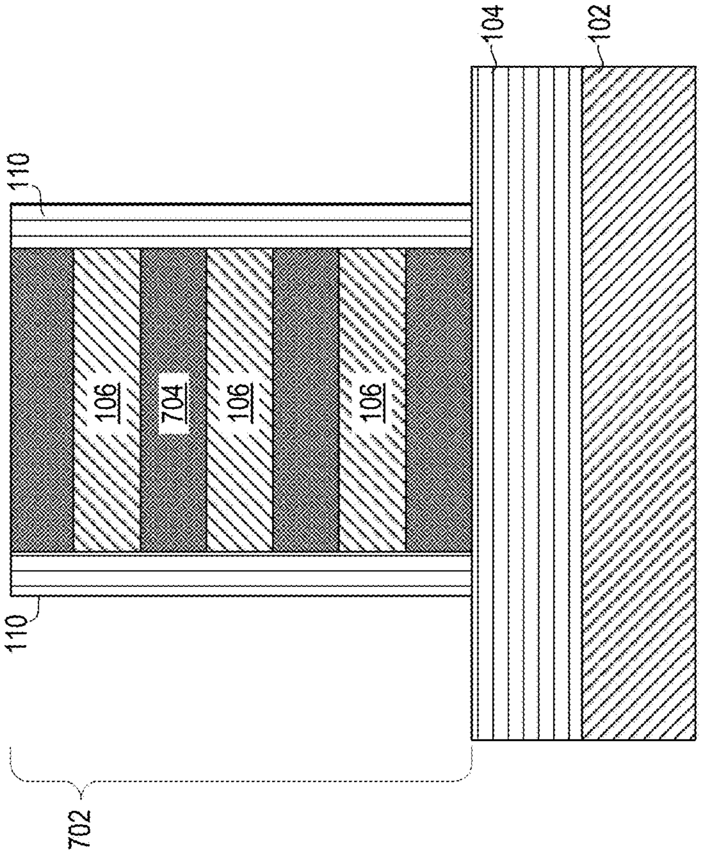
FIG. 8 is a cross-sectional side view at one step of manufacturing the transistor of FIG. 1.
Figure 9:
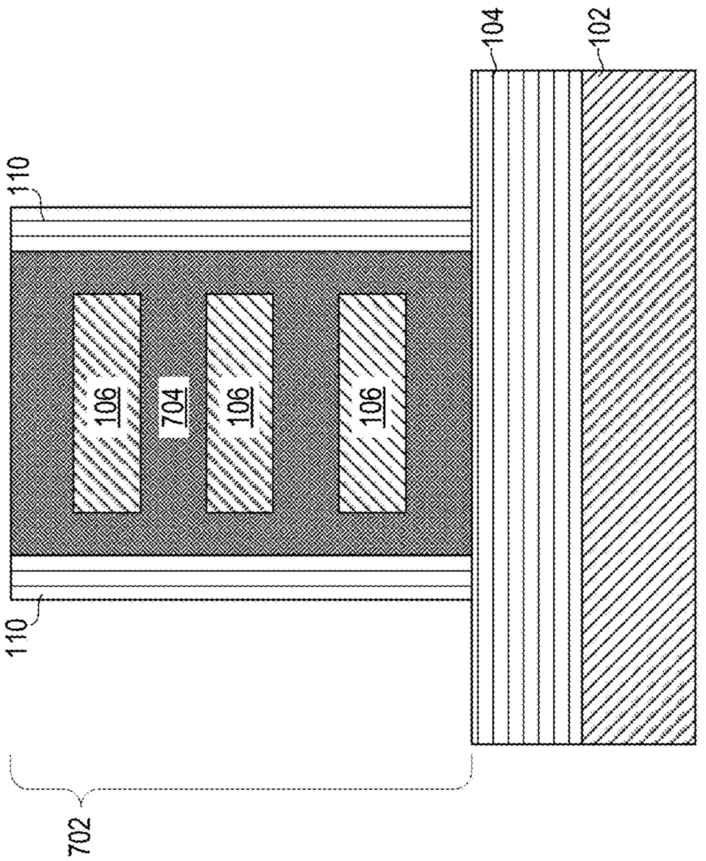
FIG. 9 is a cross-sectional side view at one step of manufacturing the transistor of FIG. 1.

In block 504, a perovskite stack 702 is applied, as shown in FIGS. 7-9. FIG. 7 shows a cross-section taken at the same view as FIG. 2, and FIGS. 8 and 9 show cross-sections taken at the same view as FIGS. 3 and 4. The layers of the stack 702 may be grown in any suitable manner, such as chemical vapor deposition, atomic layer deposition, physical vapor deposition, molecular beam epitaxy, pulsed laser deposition, etc. In the illustrative embodiment, the perovskite stack 702 includes alternating layers of lanthanum-doped barium stannate layers 106 and sacrificial layers 704. Dielectric isolation layers 110 may be deposited in block 506. Dielectric spacers 108 are deposited in block 508. In the illustrative embodiment, alternate layers of the stack 702 include a sacrificial layer 704 bounded by dielectric spacers 108, as shown in FIG. 7. In some embodiments, the stack 702 may include one, some, or all layers that are not perovskites.

In one embodiment, as shown in FIG. 8, the layers 106 extend from one dielectric isolation layer 110 to the other dielectric isolation layer 110. In such an embodiment, the layers 106 will be used to form a top and bottom gate transistor, as shown in FIG. 3. In another embodiment, as shown in FIG. 9, the layers 106 do not extend from one dielectric isolation layer 110 to the other. Rather, there is a gap between the layers 106 and the dielectric isolation layers 110 that is filled with the sacrificial layers 704. In some embodiments, layers 106 that do not extend from one dielectric isolation layer 110 to the other may be formed in a different manner, such as by forming layers 106 that do extend between the dielectric isolation layers 110, and then partially etching the layers 106 away.

The channel 106, dielectric spacers 108, and dielectric isolation layers 110 may be any suitable material described above, which will not be repeated in the interest of clarity. The sacrificial layers 704 may be any suitable material on which the channel 106 can be deposited with high quality crystal growth and which can be etched away while leaving at least some or all of the channels 106, dielectric spacers 108, and dielectric isolation layers 110 behind. For example, the sacrificial layers 704 may include $SrTiO_3$, $BaTiO_3$, $BaHfO_3$, $BaZrO_3$, $LaAlO_3$, $LaCoO_3$, $SrSnO_3$, and alloys or doped versions thereof.

In some embodiments, different parts of the layers 106 may have different densities of dopants. For example, the regions of the layers 106 that will become source regions and drain regions may have a higher dopant concentration, and layers that will become the channel may have a lower dopant concentration.

Figure 10:
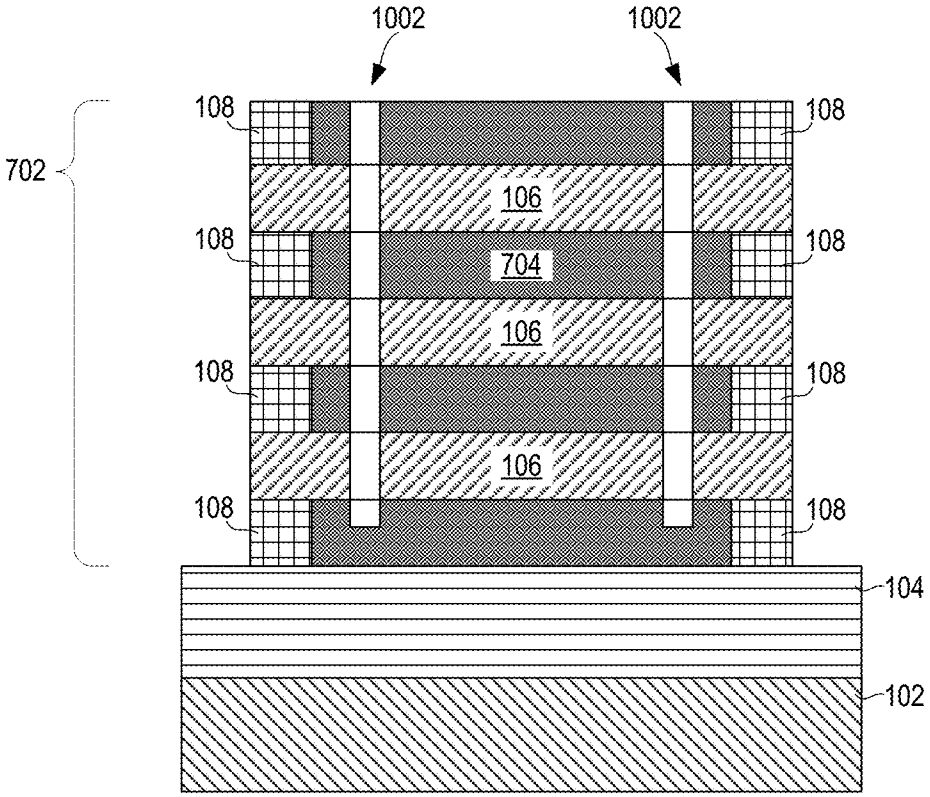
FIG. 10 is a cross-sectional side view at one step of manufacturing the transistor of FIG. 1.
Figure 11:
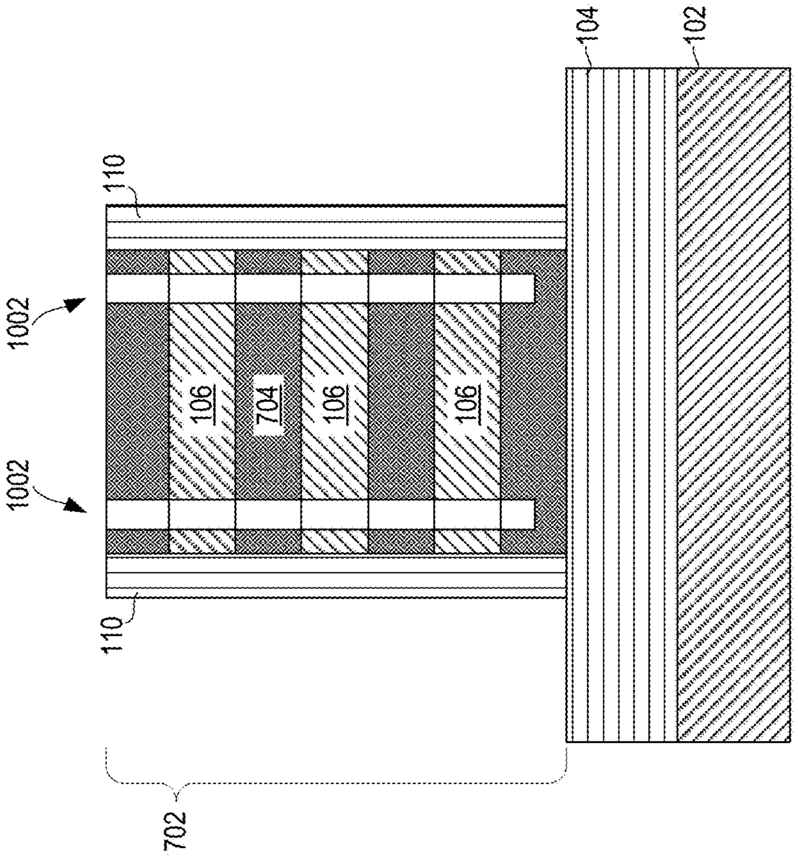
FIG. 11 is a cross-sectional side view at one step of manufacturing the transistor of FIG. 1.
Figure 12:
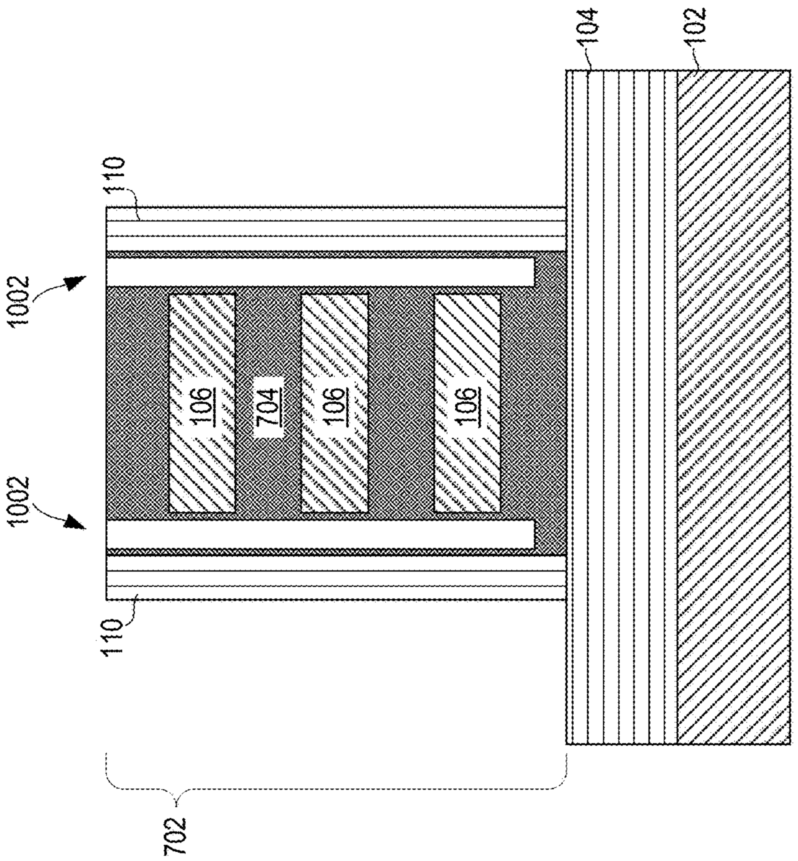
FIG. 12 is a cross-sectional side view at one step of manufacturing the transistor of FIG. 1.

In block 510, in the illustrative embodiment, one or more holes 1002 are formed in the dielectric stack, as shown in FIGS. 10-12. The holes 1002 provide access to the sacrificial layers 704 that would otherwise be fully enclosed by the layers 104, 106, 108, 110. In some embodiments, such as ones in which the layers 106 do not fully extend from one dielectric isolation layer 110 to the other dielectric isolation layer 110, the holes 1002 may not be necessary. In such embodiments, the holes 1002 may be formed in order to reduce etching time or increase etching uniformity.

Figure 13:
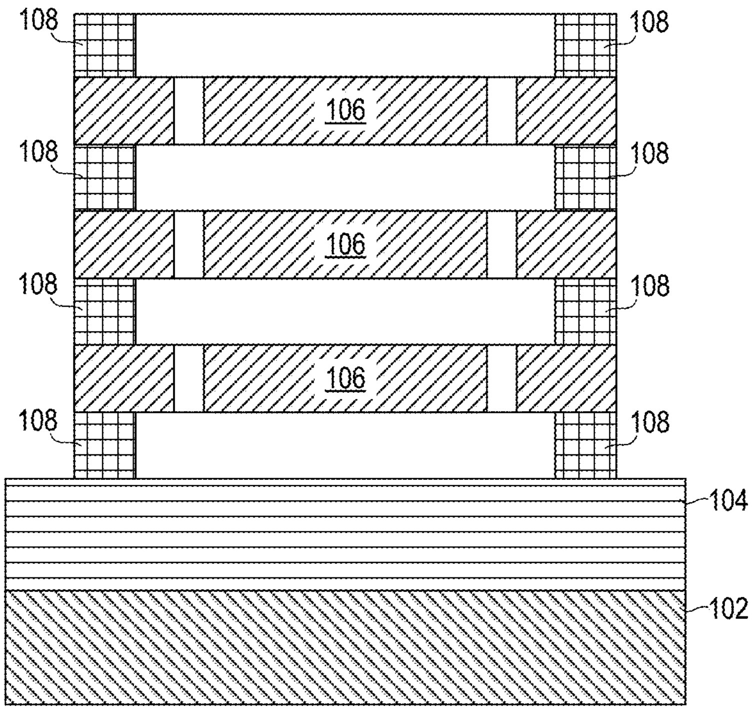
FIG. 13 is a cross-sectional side view at one step of manufacturing the transistor of FIG. 1.
Figure 15:
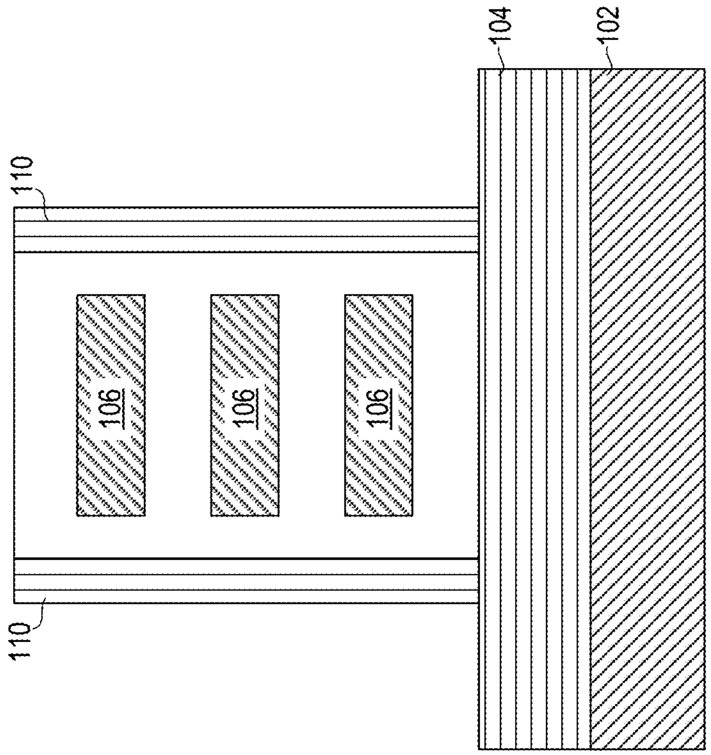
FIG. 15 is a cross-sectional side view at one step of manufacturing the transistor of FIG. 1.
Figure 14:
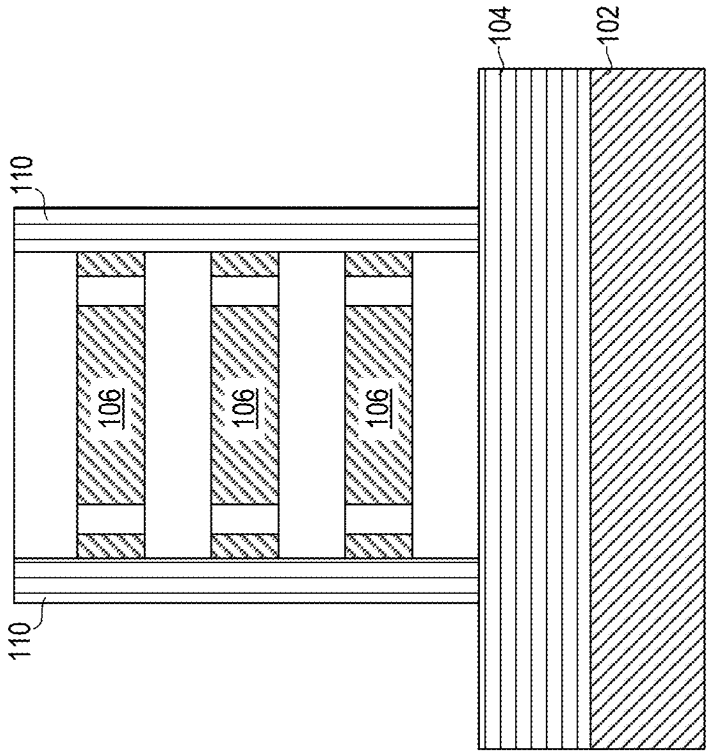
FIG. 14 is a cross-sectional side view at one step of manufacturing the transistor of FIG. 1.

In block 512, the sacrificial layers 704 of the perovskite stack 702 are selectively etched, leaving behind most or all of the layers 104, 106, 108, 110, as shown in FIGS. 13-15. The sacrificial layers 704 may be etched in any suitable manner, such as using wet etchants, a dry chemical vapor etch, or an atomic layer etch. Wet etchants may be, e.g., dilute hydrofluoric acid or hydrochloric acid. A dry chemical vapor etch of the sacrificial layers 704 may be achieved using etch ligands such as acetylacetone (Hacac), hexafluoroacetylacetone (Hhfac) along with co-reactants such as water and hydrogen peroxide vapor.

Figure 16:
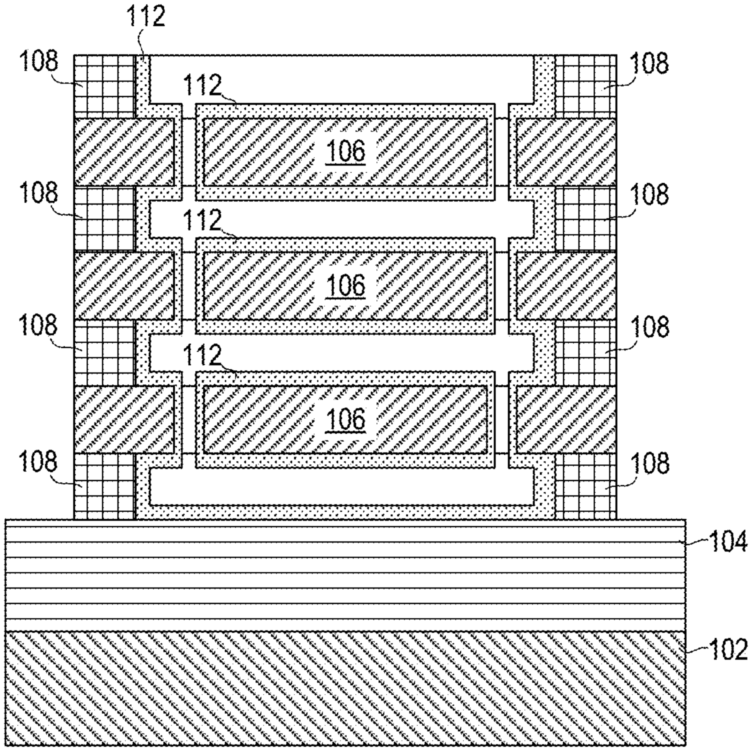
FIG. 16 is a cross-sectional side view at one step of manufacturing the transistor of FIG. 1.
Figure 18:
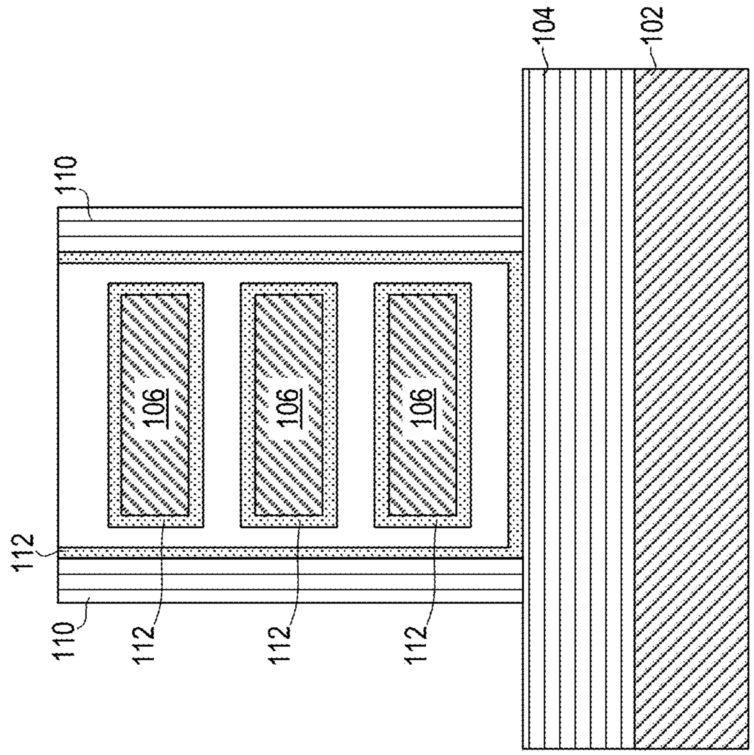
FIG. 18 is a cross-sectional side view at one step of manufacturing the transistor of FIG. 1.
Figure 17:
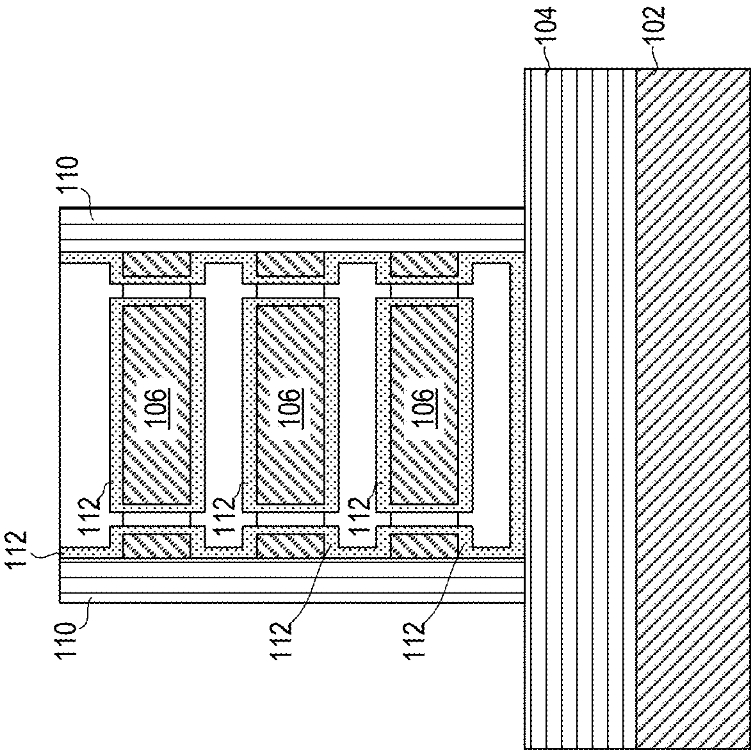
FIG. 17 is a cross-sectional side view at one step of manufacturing the transistor of FIG. 1.

In block 514, the ferroelectric layer 112 is deposited. The ferroelectric layer 112 may be any suitable ferroelectric material, such as those listed above, which will not be repeated in the interest of clarity. In the illustrative embodiment, the ferroelectric layer 112 is deposited conformally on the channel 106 and the dielectric isolation layers 110, as shown in FIGS. 16-18. In the illustrative embodiment, the ferroelectric layer 112 is lattice matched with the channel 106, forming a high-quality interface between the ferroelectric layer 112 and the channel 106 and a high-quality crystal for the ferroelectric layer 112. The ferroelectric layer 112 may be deposited using any suitable precursor. For example, if the ferroelectric layer 112 is to be $BaTiO_3$, precursors such as $Ba(thd)_2$ (where thd is 2,2,6,6-tetramethyl-3,5-heptanedionate) and $Ti(OMe)_4$ (where Me is $CH_3$) may be used with ozone as a co-reactant. As the ferroelectric layer 112 is built up layer by layer, dopants may be introduced in the ferroelectric layer 112 by adding in ALD cycles of the doping metal precursor and ozone. Depending on the overall pulse sequence used, the dopant may be uniformly distributed throughout the ferroelectric layer 112 or introduced in a graded fashion in order to improve device performance.

In some embodiments, the layer 112 is deposited as two or more sublayers, such as a linear dielectric layer and a ferroelectric layer. The linear dielectric layer may facilitate lattice matching for the ferroelectric and/or may reduce leakage current between the channel 106 and the gate 114.

It should be appreciated that, in the illustrative embodiment, the ferroelectric 112 is grown conformally directly on the channel 106 or other lattice-matched layer. If instead, for example, the structure shown in FIGS. 2-3 were grown layer-by-layer from bottom to top, part of the ferroelectric layer 112 would be grown on the gate 114, which may result in a poor quality crystalline structure for the ferroelectric layer 112 and/or layers grown on top of the ferroelectric layer 112. Growing the ferroelectric layer 112 using molecular beam epitaxy on high-quality crystalline channels 106 allows for the ferroelectric layer 112 to be high quality as well.

In block 516, the gate 114 is deposited, resulting in the structure shown in FIGS. 2-4. The gate 114 may be any suitable material, such as those listed above, which will not be repeated in the interest of clarity. In the illustrative embodiment, the gate 114 is conformal to the ferroelectric layer 112 and is applied using any suitable atomic layer deposition technique. In some embodiments, the gate 114 may be lattice matched to the ferroelectric layer 112, and the interface between the gate 114 and the ferroelectric layer 112 as well as the crystal structure of the gate 114 are high quality. In other embodiments, the gate 114 may not be lattice matched with the ferroelectric layer 112, and the interface between the layers 110, 112 may have a relatively large amount of defects.

It should be appreciated that the method 500 is one of many possible embodiments of manufacturing the transistor 100. Different approaches or orders of steps are envisioned as well. The steps of the method 500 may be done in a different order or the method 500 may include different steps for different embodiments of the transistor 100. It should be appreciated that a complete manufacturing process of an integrated circuit that includes the transistor 100 may include steps not shown in the method 500, such as polishing/etching to form a flat surface, cleaning, surface passivation, adding electrodes to the source regions and gate regions of the fins 106, adding electrodes for the gate 114, creating interconnects, packaging, etc. In some embodiments the spacers 108 may be grown into a recess left after the epitaxial complex sacrificial oxide material 704 is recessed on the exposed ends of the etch isolated ribbons 106. The spacers 108 would be formed with an anisotropic etch in the space that would later contain the source/drain contact materials at the ends of the ribbons 106. In such an embodiment, the spacers 108 may be, e.g., SiOCN and may be deposited using, e.g., traditional chemical vapor deposition and/or atomic layer deposition.

Figure 19:
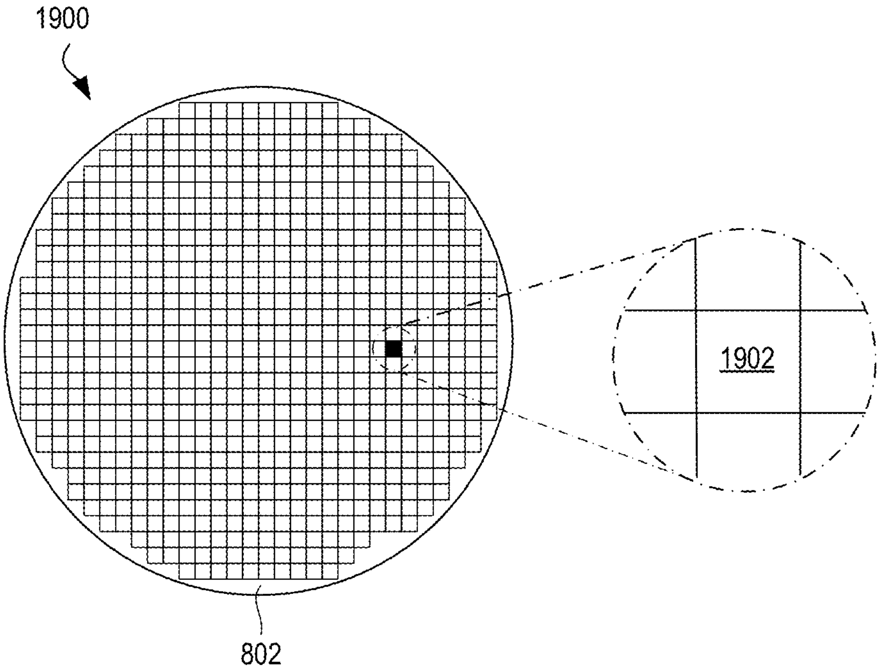
FIG. 19 is a top view of a wafer and dies that may be included in a microelectronic assembly, in accordance with any of the embodiments disclosed herein.

FIG. 19 is a top view of a wafer 1900 and dies 1902 that may be included in any of the transistors 100 disclosed herein. The wafer 1900 may be composed of semiconductor material and may include one or more dies 1902 having integrated circuit structures formed on a surface of the wafer 1900. The individual dies 1902 may be a repeating unit of an integrated circuit product that includes any suitable integrated circuit. After the fabrication of the semiconductor product is complete, the wafer 1900 may undergo a singulation process in which the dies 1902 are separated from one another to provide discrete "chips" of the integrated circuit product. The die 1902 may include one or more transistors (e.g., some of the transistors 2040 of FIG. 20, discussed below), supporting circuitry to route electrical signals to the transistors, passive components (e.g., signal traces, resistors, capacitors, or inductors), and/or any other integrated circuit components. In some embodiments, the wafer 1900 or the die 1902 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1902. For example, a memory array formed by multiple memory devices may be formed on a same die 1902 as a processor unit (e.g., the processor unit 2302 of FIG. 23) or other logic that is configured to store information in the memory devices or execute instructions stored in the memory array. Various ones of the transistors 100 disclosed herein may be manufactured using a die-to-wafer assembly technique in which some dies are attached to a wafer 1900 that include others of the dies, and the wafer 1900 is subsequently singulated.

Figure 20:
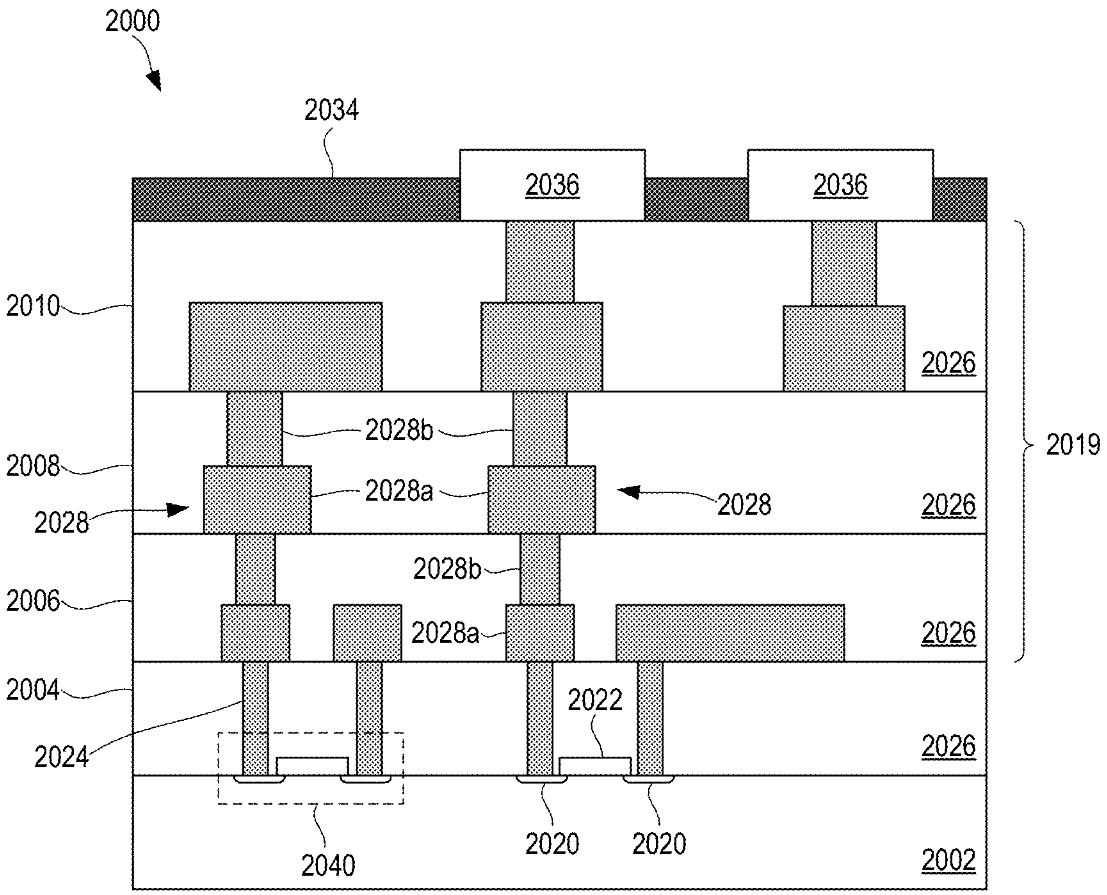
FIG. 20 is a cross-sectional side view of an integrated circuit device that may be included in a microelectronic assembly, in accordance with any of the embodiments disclosed herein.

FIG. 20 is a cross-sectional side view of an integrated circuit device 2000 that may include any of the transistors 100 disclosed herein. One or more of the integrated circuit devices 2000 may be included in one or more dies 1902 (FIG. 19). The integrated circuit device 2000 may be formed on a die substrate 2002 (e.g., the wafer 1900 of FIG. 19) and may be included in a die (e.g., the die 1902 of FIG. 19). The die substrate 2002 may be a semiconductor substrate composed of semiconductor material systems including, for example, n-type or p-type materials systems (or a combination of both). The die substrate 2002 may include, for example, a crystalline substrate formed using a bulk silicon or a silicon-on-insulator (SOI) substructure. In some embodiments, the die substrate 2002 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 2002. Although a few examples of materials from which the die substrate 2002 may be formed are described here, any material that may serve as a foundation for an integrated circuit device 2000 may be used. The die substrate 2002 may be part of a singulated die (e.g., the dies 1902 of FIG. 19) or a wafer (e.g., the wafer 1900 of FIG. 19).

The integrated circuit device 2000 may include one or more device layers 2004 disposed on the die substrate 2002. The device layer 2004 may include features of one or more transistors 2040 (e.g., metal oxide semiconductor field-effect transistors (MOSFETs)) formed on the die substrate 2002. The transistors 2040 may include, for example, one or more source and/or drain (S/D) regions 2020, a gate 2022 to control current flow between the S/D regions 2020, and one or more S/D contacts 2024 to route electrical signals to/from the S/D regions 2020. The transistors 2040 may include additional features not depicted for the sake of clarity, such as device isolation regions, gate contacts, and the like. The transistors 2040 are not limited to the type and configuration depicted in FIG. 20 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 21A-21D are simplified perspective views of example planar, FinFET, gate-all-around, and stacked gate-all-around transistors. The transistors illustrated in FIGS. 21A-21D are formed on a substrate 2116 having a surface 2108. Isolation regions 2114 separate the source and drain regions of the transistors from other transistors and from a bulk region 2118 of the substrate 2116.

Figure 21A:
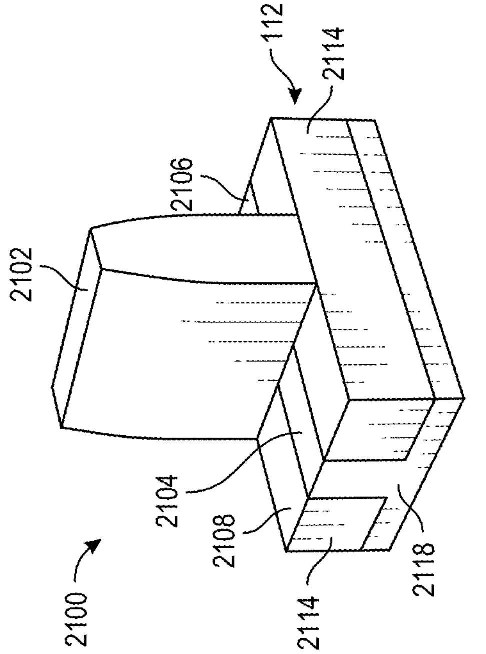
FIGS. 21A-21D are perspective views of example planar, FinFET, gate-all-around, and stacked gate-all-around transistors.

FIG. 21A is a perspective view of an example planar transistor 2100 comprising a gate 2102 that controls current flow between a source region 2104 and a drain region 2106. The transistor 2100 is planar in that the source region 2104 and the drain region 2106 are planar with respect to the substrate surface 2108.

Figure 21B:
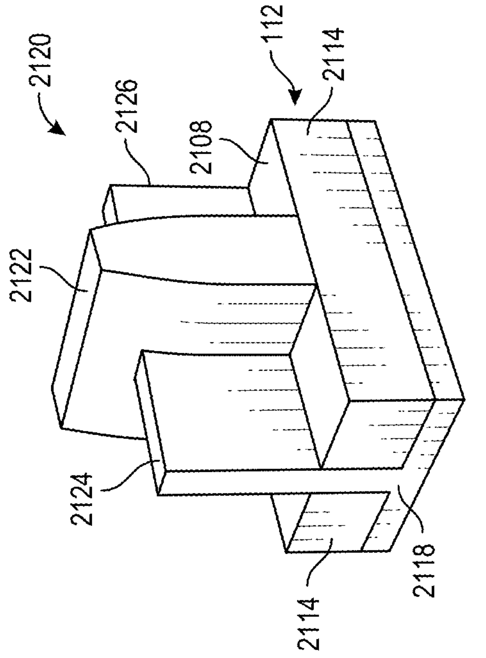

FIG. 21B is a perspective view of an example FinFET transistor 2120 comprising a gate 2122 that controls current flow between a source region 2124 and a drain region 2126. The transistor 2120 is non-planar in that the source region 2124 and the drain region 2126 comprise "fins" that extend upwards from the substrate surface 2128. As the gate 2122 encompasses three sides of the semiconductor fin that extends from the source region 2124 to the drain region 2126, the transistor 2120 can be considered a tri-gate transistor. FIG. 21B illustrates one S/D fin extending through the gate 2122, but multiple S/D fins can extend through the gate of a FinFET transistor.

Figure 21C:
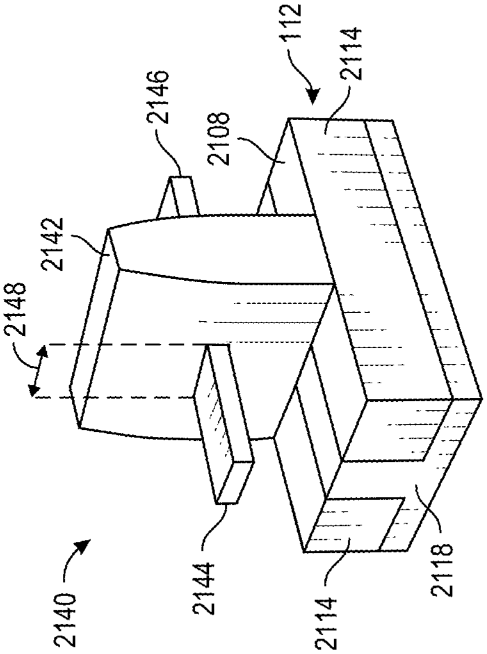

FIG. 21C is a perspective view of a gate-all-around (GAA) transistor 2140 comprising a gate 2142 that controls current flow between a source region 2144 and a drain region 2146. The transistor 2140 is non-planar in that the source region 2144 and the drain region 2146 are elevated from the substrate surface 2128.

Figure 21D:
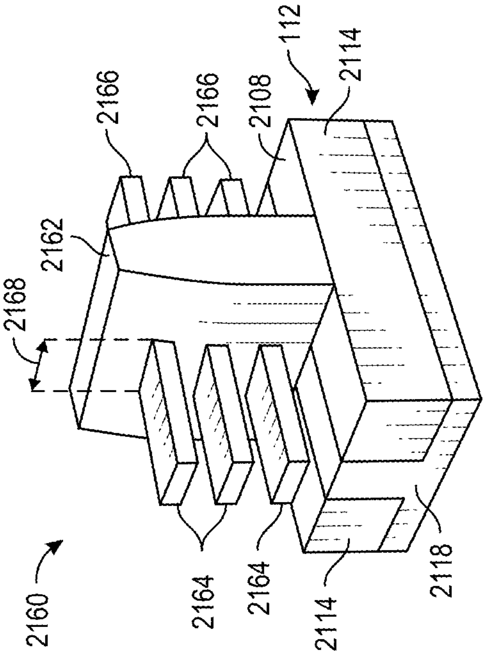

FIG. 21D is a perspective view of a GAA transistor 2160 comprising a gate 2162 that controls current flow between multiple elevated source regions 2164 and multiple elevated drain regions 2166. The transistor 2160 is a stacked GAA transistor as the gate controls the flow of current between multiple elevated S/D regions stacked on top of each other. The transistors 2140 and 2160 are considered gate-all-around transistors as the gates encompass all sides of the semiconductor portions that extends from the source regions to the drain regions. The transistors 2140 and 2160 can alternatively be referred to as nanowire, nanosheet, or nanoribbon transistors depending on the width (e.g., widths 2148 and 2168 of transistors 2140 and 2160, respectively) of the semiconductor portions extending through the gate.

Returning to FIG. 20, a transistor 2040 may include a gate 2022 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 2040 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 2040 along the source-channel-drain direction, the gate electrode may consist of a U-shaped structure that includes a bottom portion substantially parallel to the surface of the die substrate 2002 and two sidewall portions that are substantially perpendicular to the top surface of the die substrate 2002. In other embodiments, at least one of the metal layers that form the gate electrode may simply be a planar layer that is substantially parallel to the top surface of the die substrate 2002 and does not include sidewall portions substantially perpendicular to the top surface of the die substrate 2002. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2020 may be formed within the die substrate 2002 adjacent to the gate 2022 of individual transistors 2040. The S/D regions 2020 may be formed using an implantation/diffusion process or an etching/deposition process, for example. In the former process, dopants such as boron, aluminum, antimony, phosphorous, or arsenic may be ion-implanted into the die substrate 2002 to form the S/D regions 2020. An annealing process that activates the dopants and causes them to diffuse farther into the die substrate 2002 may follow the ion-implantation process. In the latter process, the die substrate 2002 may first be etched to form recesses at the locations of the S/D regions 2020. An epitaxial deposition process may then be carried out to fill the recesses with material that is used to fabricate the S/D regions 2020. In some implementations, the S/D regions 2020 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2020 may be formed using one or more alternate semiconductor materials such as germanium or a group III-V material or alloy. In further embodiments, one or more layers of metal and/or metal alloys may be used to form the S/D regions 2020.

Electrical signals, such as power and/or input/output (I/O) signals, may be routed to and/or from the devices (e.g., transistors 2040) of the device layer 2004 through one or more interconnect layers disposed on the device layer 2004 (illustrated in FIG. 20 as interconnect layers 2006-2010). For example, electrically conductive features of the device layer 2004 (e.g., the gate 2022 and the S/D contacts 2024) may be electrically coupled with the interconnect structures 2028 of the interconnect layers 2006-2010. The one or more interconnect layers 2006-2010 may form a metallization stack (also referred to as an "ILD stack") 2019 of the integrated circuit device 2000.

The interconnect structures 2028 may be arranged within the interconnect layers 2006-2010 to route electrical signals according to a wide variety of designs; in particular, the arrangement is not limited to the particular configuration of interconnect structures 2028 depicted in FIG. 20. Although a particular number of interconnect layers 2006-2010 is depicted in FIG. 20, embodiments of the present disclosure include integrated circuit devices having more or fewer interconnect layers than depicted.

In some embodiments, the interconnect structures 2028 may include lines 2028*a* and/or vias 2028*b* filled with an electrically conductive material such as a metal. The lines 2028*a* may be arranged to route electrical signals in a direction of a plane that is substantially parallel with a surface of the die substrate 2002 upon which the device layer 2004 is formed. For example, the lines 2028*a* may route electrical signals in a direction in and out of the page and/or in a direction across the page. The vias 2028*b* may be arranged to route electrical signals in a direction of a plane that is substantially perpendicular to the surface of the die substrate 2002 upon which the device layer 2004 is formed. In some embodiments, the vias 2028*b* may electrically couple lines 2028*a* of different interconnect layers 2006-2010 together.

The interconnect layers 2006-2010 may include a dielectric material 2026 disposed between the interconnect structures 2028, as shown in FIG. 20. In some embodiments, dielectric material 2026 disposed between the interconnect structures 2028 in different ones of the interconnect layers 2006-2010 may have different compositions; in other embodiments, the composition of the dielectric material 2026 between different interconnect layers 2006-2010 may be the same. The device layer 2004 may include a dielectric material 2026 disposed between the transistors 2040 and a bottom layer of the metallization stack as well. The dielectric material 2026 included in the device layer 2004 may have a different composition than the dielectric material 2026 included in the interconnect layers 2006-2010; in other embodiments, the composition of the dielectric material 2026 in the device layer 2004 may be the same as a dielectric material 2026 included in any one of the interconnect layers 2006-2010.

A first interconnect layer 2006 (referred to as Metal 1 or "M1") may be formed directly on the device layer 2004. In some embodiments, the first interconnect layer 2006 may include lines 2028*a* and/or vias 2028*b*, as shown. The lines 2028*a* of the first interconnect layer 2006 may be coupled with contacts (e.g., the S/D contacts 2024) of the device layer 2004. The vias 2028*b* of the first interconnect layer 2006 may be coupled with the lines 2028*a* of a second interconnect layer 2008.

The second interconnect layer 2008 (referred to as Metal 2 or "M2") may be formed directly on the first interconnect layer 2006. In some embodiments, the second interconnect layer 2008 may include via 2028*b* to couple the lines 2028 of the second interconnect layer 2008 with the lines 2028*a* of a third interconnect layer 2010. Although the lines 2028*a* and the vias 2028*b* are structurally delineated with a line within individual interconnect layers for the sake of clarity, the lines 2028*a* and the vias 2028*b* may be structurally and/or materially contiguous (e.g., simultaneously filled during a dual-damascene process) in some embodiments.

The third interconnect layer 2010 (referred to as Metal 3 or "M3") (and additional interconnect layers, as desired) may be formed in succession on the second interconnect layer 2008 according to similar techniques and configurations described in connection with the second interconnect layer 2008 or the first interconnect layer 2006. In some embodiments, the interconnect layers that are "higher up" in the metallization stack 2019 in the integrated circuit device 2000 (i.e., farther away from the device layer 2004) may be thicker that the interconnect layers that are lower in the metallization stack 2019, with lines 2028*a* and vias 2028*b* in the higher interconnect layers being thicker than those in the lower interconnect layers.

The integrated circuit device 2000 may include a solder resist material 2034 (e.g., polyimide or similar material) and one or more conductive contacts 2036 formed on the interconnect layers 2006-2010. In FIG. 20, the conductive contacts 2036 are illustrated as taking the form of bond pads. The conductive contacts 2036 may be electrically coupled with the interconnect structures 2028 and configured to route the electrical signals of the transistor(s) 2040 to external devices. For example, solder bonds may be formed on the one or more conductive contacts 2036 to mechanically and/or electrically couple an integrated circuit die including the integrated circuit device 2000 with another component (e.g., a printed circuit board). The integrated circuit device 2000 may include additional or alternate structures to route the electrical signals from the interconnect layers 2006-2010; for example, the conductive contacts 2036 may include other analogous features (e.g., posts) that route the electrical signals to external components.

In some embodiments in which the integrated circuit device 2000 is a double-sided die, the integrated circuit device 2000 may include another metallization stack (not shown) on the opposite side of the device layer(s) 2004. This metallization stack may include multiple interconnect layers as discussed above with reference to the interconnect layers 2006-2010, to provide conductive pathways (e.g., including conductive lines and vias) between the device layer(s) 2004 and additional conductive contacts (not shown) on the opposite side of the integrated circuit device 2000 from the conductive contacts 2036.

In other embodiments in which the integrated circuit device 2000 is a double-sided die, the integrated circuit device 2000 may include one or more through silicon vias (TSVs) through the die substrate 2002; these TSVs may make contact with the device layer(s) 2004, and may provide conductive pathways between the device layer(s) 2004 and additional conductive contacts (not shown) on the opposite side of the integrated circuit device 2000 from the conductive contacts 2036. In some embodiments, TSVs extending through the substrate can be used for routing power and ground signals from conductive contacts on the opposite side of the integrated circuit device 2000 from the conductive contacts 2036 to the transistors 2040 and any other components integrated into the die 2000, and the metallization stack 2019 can be used to route I/O signals from the conductive contacts 2036 to transistors 2040 and any other components integrated into the die 2000.

Multiple integrated circuit devices 2000 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 22:
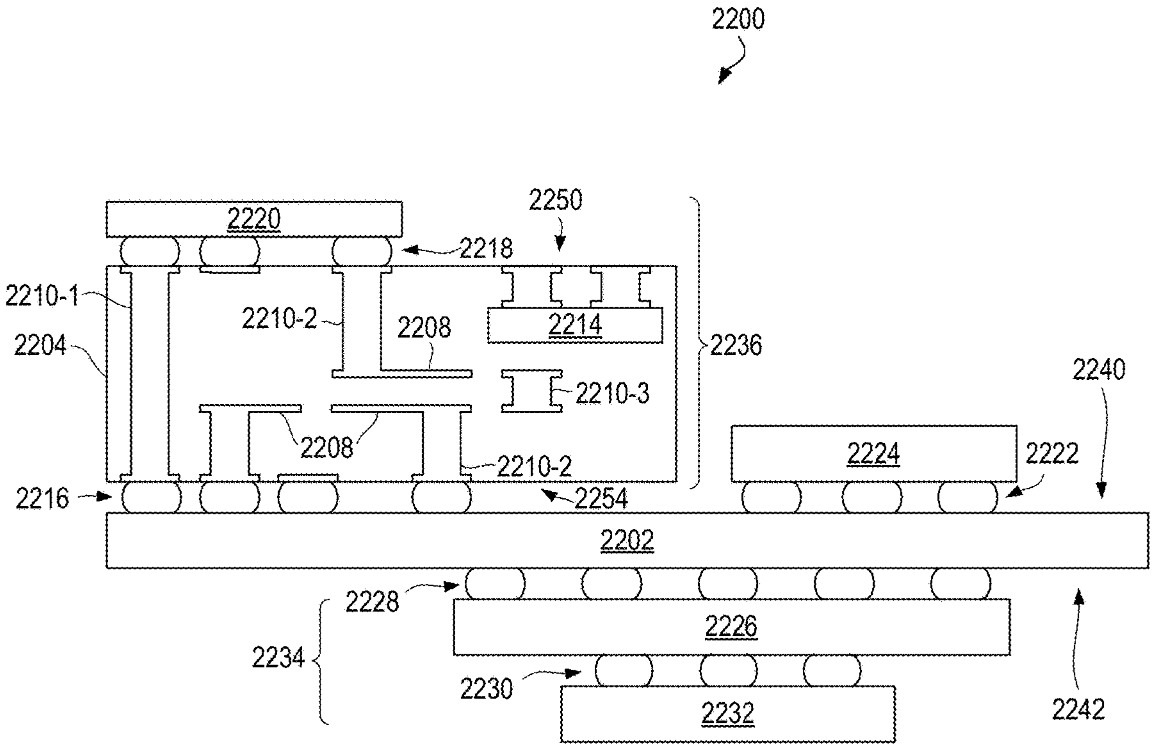
FIG. 22 is a cross-sectional side view of an integrated circuit device assembly that may include a microelectronic assembly, in accordance with any of the embodiments disclosed herein.

FIG. 22 is a cross-sectional side view of an integrated circuit device assembly 2200 that may include any of the transistors 100 disclosed herein. The integrated circuit device assembly 2200 includes a number of components disposed on a circuit board 2202 (which may be a motherboard, system board, mainboard, etc.). The integrated circuit device assembly 2200 includes components disposed on a first face 2240 of the circuit board 2202 and an opposing second face 2242 of the circuit board 2202; generally, components may be disposed on one or both faces 2240 and 2242.

In some embodiments, the circuit board 2202 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 2202. In other embodiments, the circuit board 2202 may be a non-PCB substrate. The integrated circuit device assembly 2200 illustrated in FIG. 22 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 22), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 2236 may include an integrated circuit component 2220 coupled to an interposer 2204 by coupling components 2218. The coupling components 2218 may take any suitable form for the application, such as the forms discussed above with reference to the coupling components 2216. Although a single integrated circuit component 2220 is shown in FIG. 22, multiple integrated circuit components may be coupled to the interposer 2204; indeed, additional interposers may be coupled to the interposer 2204. The interposer 2204 may provide an intervening substrate used to bridge the circuit board 2202 and the integrated circuit component 2220.

The integrated circuit component 2220 may be a packaged or unpacked integrated circuit product that includes one or more integrated circuit dies (e.g., the die 1902 of FIG. 19, the integrated circuit device 2000 of FIG. 20) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 2220, a single monolithic integrated circuit die comprises solder bumps attached to contacts on the die. The solder bumps allow the die to be directly attached to the interposer 2204. The integrated circuit component 2220 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 2220 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 2220 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 2220 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 2204 may spread connections to a wider pitch or reroute a connection to a different connection. For example, the interposer 2204 may couple the integrated circuit component 2220 to a set of ball grid array (BGA) conductive contacts of the coupling components 2216 for coupling to the circuit board 2202. In the embodiment illustrated in FIG. 22, the integrated circuit component 2220 and the circuit board 2202 are attached to opposing sides of the interposer 2204; in other embodiments, the integrated circuit component 2220 and the circuit board 2202 may be attached to a same side of the interposer 2204. In some embodiments, three or more components may be interconnected by way of the interposer 2204.

In some embodiments, the interposer 2204 may be formed as a PCB, including multiple metal layers separated from one another by layers of dielectric material and interconnected by electrically conductive vias. In some embodiments, the interposer 2204 may be formed of an epoxy resin, a fiberglass-reinforced epoxy resin, an epoxy resin with inorganic fillers, a ceramic material, or a polymer material such as polyimide. In some embodiments, the interposer 2204 may be formed of alternate rigid or flexible materials that may include the same materials described above for use in a semiconductor substrate, such as silicon, germanium, and other group III-V and group IV materials. The interposer 2204 may include metal interconnects 2208 and vias 2210, including but not limited to through hole vias 2210-1 (that extend from a first face 2250 of the interposer 2204 to a second face 2254 of the interposer 2204), blind vias 2210-2 (that extend from the first or second faces 2250 or 2254 of the interposer 2204 to an internal metal layer), and buried vias 2210-3 (that connect internal metal layers).

In some embodiments, the interposer 2204 can comprise a silicon interposer. Through silicon vias (TSV) extending through the silicon interposer can connect connections on a first face of a silicon interposer to an opposing second face of the silicon interposer. In some embodiments, an interposer 2204 comprising a silicon interposer can further comprise one or more routing layers to route connections on a first face of the interposer 2204 to an opposing second face of the interposer 2204.

The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art. In embodiments where the interposer is a non-printed circuit board The integrated circuit device assembly 2200 may include an integrated circuit component 2224 coupled to the first face 2240 of the circuit board 2202 by coupling components 2222. The coupling components 2222 may take the form of any of the embodiments discussed above with reference to the coupling components 2216, and the integrated circuit component 2224 may take the form of any of the embodiments discussed above with reference to the integrated circuit component 2220.

The integrated circuit device assembly 2200 illustrated in FIG. 22 includes a package-on-package structure 2234 coupled to the second face 2242 of the circuit board 2202 by coupling components 2228. The package-on-package structure 2234 may include an integrated circuit component 2226 and an integrated circuit component 2232 coupled together by coupling components 2230 such that the integrated circuit component 2226 is disposed between the circuit board 2202 and the integrated circuit component 2232. The coupling components 2228 and 2230 may take the form of any of the embodiments of the coupling components 2216 discussed above, and the integrated circuit components 2226 and 2232 may take the form of any of the embodiments of the integrated circuit component 2220 discussed above. The package-on-package structure 2234 may be configured in accordance with any of the package-on-package structures known in the art.

Figure 23:
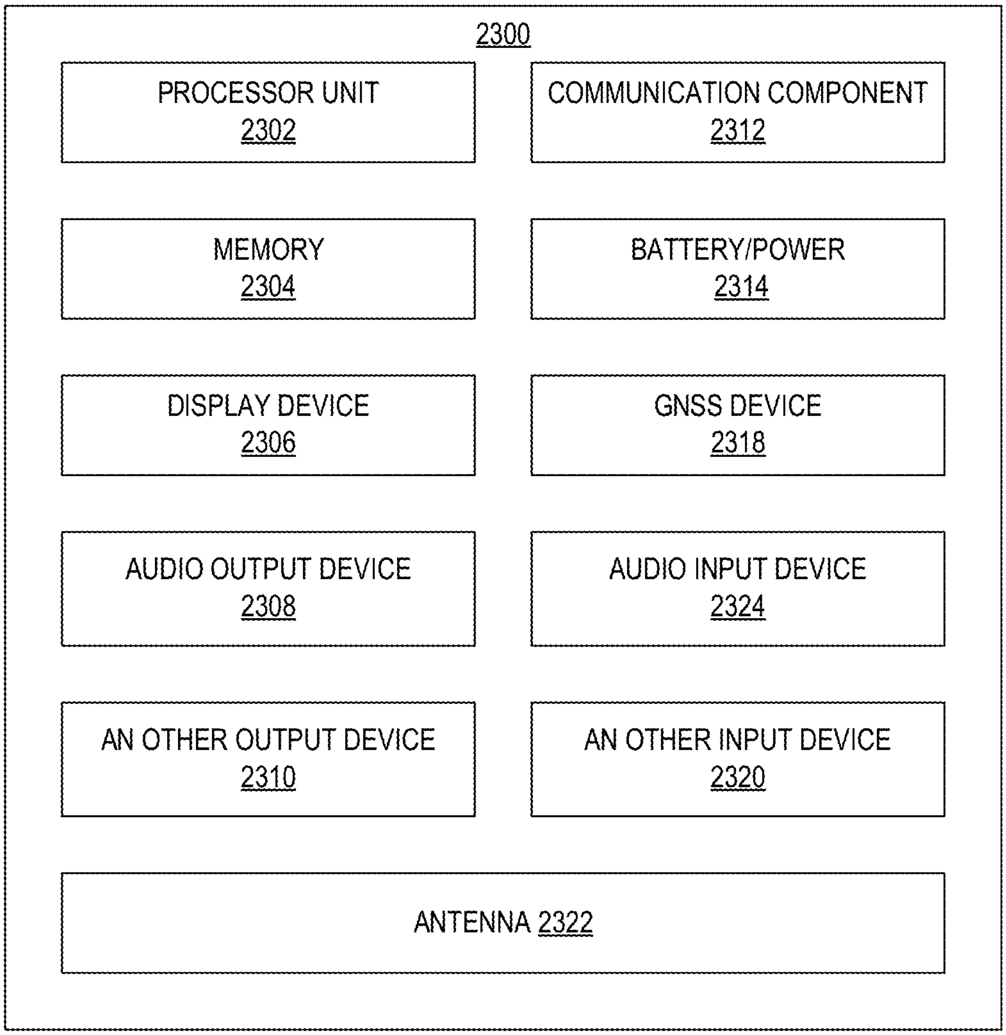
FIG. 23 is a block diagram of an example electrical device that may include a microelectronic assembly, in accordance with any of the embodiments disclosed herein.

FIG. 23 is a block diagram of an example electrical device 2300 that may include one or more of the transistors 100 disclosed herein. For example, any suitable ones of the components of the electrical device 2300 may include one or more of the integrated circuit device assemblies 2200, integrated circuit components 2220, integrated circuit devices 2000, or integrated circuit dies 1902 disclosed herein. A number of components are illustrated in FIG. 23 as included in the electrical device 2300, but any one or more of these components may be omitted or duplicated, as suitable for the application. In some embodiments, some or all of the components included in the electrical device 2300 may be attached to one or more motherboards mainboards, or system boards. In some embodiments, one or more of these components are fabricated onto a single system-on-a-chip (SoC) die.

Additionally, in various embodiments, the electrical device 2300 may not include one or more of the components illustrated in FIG. 23, but the electrical device 2300 may include interface circuitry for coupling to the one or more components. For example, the electrical device 2300 may not include a display device 2306, but may include display device interface circuitry (e.g., a connector and driver circuitry) to which a display device 2306 may be coupled. In another set of examples, the electrical device 2300 may not include an audio input device 2324 or an audio output device 2308, but may include audio input or output device interface circuitry (e.g., connectors and supporting circuitry) to which an audio input device 2324 or audio output device 2308 may be coupled.

The electrical device 2300 may include one or more processor units 2302 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 2302 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 2300 may include a memory 2304, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 2304 may include memory that is located on the same integrated circuit die as the processor unit 2302. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 2300 can comprise one or more processor units 2302 that are heterogeneous or asymmetric to another processor unit 2302 in the electrical device 2300. There can be a variety of differences between the processing units 2302 in a system in terms of a spectrum of metrics of merit including architectural, microarchitectural, thermal, power consumption characteristics, and the like. These differences can effectively manifest themselves as asymmetry and heterogeneity among the processor units 2302 in the electrical device 2300.

In some embodiments, the electrical device 2300 may include a communication component 2312 (e.g., one or more communication components). For example, the communication component 2312 can manage wireless communications for the transfer of data to and from the electrical device 2300. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 2312 may operate in accordance with other wireless protocols in other embodiments. The electrical device 2300 may include an antenna 2322 to facilitate wireless communications and/or to receive other wireless communications (such as AM or FM radio transmissions).

In some embodiments, the communication component 2312 may manage wired communications, such as electrical, optical, or any other suitable communication protocols (e.g., IEEE 802.3 Ethernet standards). As noted above, the communication component 2312 may include multiple communication components. For instance, a first communication component 2312 may be dedicated to shorter-range wireless communications such as Wi-Fi or Bluetooth, and a second communication component 2312 may be dedicated to longer-range wireless communications such as global positioning system (GPS), EDGE, GPRS, CDMA, WiMAX, LTE, EV-DO, or others. In some embodiments, a first communication component 2312 may be dedicated to wireless communications, and a second communication component 2312 may be dedicated to wired communications.

The electrical device 2300 may include battery/power circuitry 2314. The battery/power circuitry 2314 may include one or more energy storage devices (e.g., batteries or capacitors) and/or circuitry for coupling components of the electrical device 2300 to an energy source separate from the electrical device 2300 (e.g., AC line power).

The electrical device 2300 may include a display device 2306 (or corresponding interface circuitry, as discussed above). The display device 2306 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 2300 may include an audio output device 2308 (or corresponding interface circuitry, as discussed above). The audio output device 2308 may include any embedded or wired or wirelessly connected external device that generates an audible indicator, such speakers, headsets, or earbuds.

The electrical device 2300 may include an audio input device 2324 (or corresponding interface circuitry, as discussed above). The audio input device 2324 may include any embedded or wired or wirelessly connected device that generates a signal representative of a sound, such as microphones, microphone arrays, or digital instruments (e.g., instruments having a musical instrument digital interface (MIDI) output). The electrical device 2300 may include a Global Navigation Satellite System (GNSS) device 2318 (or corresponding interface circuitry, as discussed above), such as a Global Positioning System (GPS) device. The GNSS device 2318 may be in communication with a satellite-based system and may determine a geolocation of the electrical device 2300 based on information received from one or more GNSS satellites, as known in the art.

The electrical device 2300 may include an other output device 2310 (or corresponding interface circuitry, as discussed above). Examples of the other output device 2310 may include an audio codec, a video codec, a printer, a wired or wireless transmitter for providing information to other devices, or an additional storage device.

The electrical device 2300 may include an other input device 2320 (or corresponding interface circuitry, as discussed above). Examples of the other input device 2320 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 2300 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 2300 may be any other electronic device that processes data. In some embodiments, the electrical device 2300 may comprise multiple discrete physical components. Given the range of devices that the electrical device 2300 can be manifested as in various embodiments, in some embodiments, the electrical device 2300 can be referred to as a computing device or a computing system.

EXAMPLES

Illustrative examples of the technologies disclosed herein are provided below. An embodiment of the technologies may include any one or more, and any combination of, the examples described below.

Example 1 includes a device comprising a substrate; a first dielectric isolation layer adjacent the substrate; a second dielectric isolation layer adjacent the substrate; a plurality of fins, wherein the plurality of fins are disposed between the first dielectric isolation layer and the second dielectric isolation layer; a ferroelectric layer, wherein the ferroelectric layer is conformal to the plurality of fins, the first dielectric isolation layer, and the second dielectric isolation layer; and a gate layer, wherein the gate layer is conformal to the ferroelectric layer.

Example 2 includes the subject matter of Example 1, and wherein the plurality of fins comprise lanthanum, barium, tin, and oxygen.

Example 3 includes the subject matter of any of Examples 1 and 2, and wherein, at a cross-section of the device, the gate layer surrounds individual fins of the plurality of fins.

Example 4 includes the subject matter of any of Examples 1-3, and wherein, at a cross-section of the device, the gate layer is above and below individual fins of the plurality of fins.

Example 5 includes the subject matter of any of Examples 1-4, and wherein the plurality of fins are a perovskite.

Example 6 includes the subject matter of any of Examples 1-5, and wherein the ferroelectric layer is a perovskite.

Example 7 includes the subject matter of any of Examples 1-6, and wherein the gate layer is a perovskite.

Example 8 includes the subject matter of any of Examples 1-7, and wherein the gate layer comprises ruthenium, iridium, platinum, palladium, molybdenum, rhodium, rhenium, or tungsten.

Example 9 includes the subject matter of any of Examples 1-8, and wherein the first dielectric isolation layer comprises silicon and nitrogen, wherein the second dielectric isolation layer comprises silicon and nitrogen.

Example 10 includes the subject matter of any of Examples 1-9, and further including a plurality of spacers, wherein the plurality of spacers are interleaved with the plurality of fins.

Example 11 includes the subject matter of any of Examples 1-10, and wherein the plurality of spacers comprise barium, tin, and oxygen.

Example 12 includes the subject matter of any of Examples 1-11, and wherein a density of lanthanum in the plurality of spacers is less than 10% of a density of lanthanum in the plurality of fins.

Example 13 includes the subject matter of any of Examples 1-12, and wherein the plurality of spacers comprise a perovskite.

Example 14 includes the subject matter of any of Examples 1-13, and wherein the plurality of spacers comprise strontium, titanium, and oxygen.

Example 15 includes the subject matter of any of Examples 1-14, and wherein the plurality of spacers comprise strontium, ruthenium, and oxygen.

Example 16 includes the subject matter of any of Examples 1-15, and wherein the plurality of spacers comprise strontium, barium, ruthenium, and oxygen.

Example 17 includes the subject matter of any of Examples 1-16, and wherein the plurality of spacers comprise lanthanum, lutetium, and oxygen.

Example 18 includes the subject matter of any of Examples 1-17, and wherein the plurality of spacers comprise lanthanum, lutetium, scandium, and oxygen.

Example 19 includes the subject matter of any of Examples 1-18, and wherein the plurality of spacers comprise barium, scandium, niobium, and oxygen.

Example 20 includes the subject matter of any of Examples 1-19, and wherein the plurality of fins are a doped semiconductor and the plurality of spacers are an undoped semiconductor.

Example 21 includes the subject matter of any of Examples 1-20, and wherein a lattice constant of the plurality of spacers is within 3% of a lattice constant of the plurality of fins.

Example 22 includes the subject matter of any of Examples 1-21, and wherein a lattice constant of the plurality of spacers is 1%-5% larger than a lattice constant of the plurality of fins.

Example 23 includes the subject matter of any of Examples 1-22, and wherein a lattice constant of the ferroelectric layer is within 3% of a lattice constant of the plurality of fins.

Example 24 includes the subject matter of any of Examples 1-23, and wherein the ferroelectric layer comprises barium, titanium, and oxygen.

Example 25 includes the subject matter of any of Examples 1-24, and wherein the ferroelectric layer comprises bismuth, iron, and oxygen.

Example 26 includes a processor comprising the device of any of Examples 1-25.

Example 27 includes a system comprising the processor of Example 26 and one or more memory devices.

Example 28 includes a method comprising depositing a first dielectric isolation layer adjacent a substrate; depositing a second dielectric isolation layer adjacent the substrate; depositing a multilayer stack, wherein the multilayer stack comprises a first plurality of layers and a second plurality of layers, wherein individual layers of the first plurality of layers are doped semiconductor layers, wherein the first plurality of layers alternate with the second plurality of layers, wherein the multilayer stack is disposed between the first dielectric isolation layer and the second dielectric isolation layer; etching the second plurality of layers to create a plurality of fins from the first plurality of layers; epitaxially depositing a ferroelectric layer on the plurality of fins, a surface of the first dielectric isolation layer, and a surface of the second dielectric isolation layer; and depositing a gate on the ferroelectric layer.

Example 29 includes the subject matter of Example 28, and wherein etching the second plurality of layers comprises exposing the first plurality of layers and the second plurality of layers to a wet etchant, wherein the wet etchant preferentially etches the second plurality of layers.

Example 30 includes the subject matter of any of Examples 28 and 29, and wherein etching the second plurality of layers comprises exposing the first plurality of layers and the second plurality of layers to a dry chemical vapor etch.

Example 31 includes the subject matter of any of Examples 28-30, and wherein etching the second plurality of layers comprises exposing the first plurality of layers and the second plurality of layers to an atomic layer etch.

Example 32 includes the subject matter of any of Examples 28-31, and wherein the ferroelectric layer is conformal to the plurality of fins, the first dielectric isolation layer, and the second dielectric isolation layer.

Example 33 includes the subject matter of any of Examples 28-32, and wherein the plurality of fins are a perovskite.

Example 34 includes the subject matter of any of Examples 28-33, and wherein the ferroelectric layer is a perovskite.

Example 35 includes the subject matter of any of Examples 28-34, and wherein the gate is a perovskite.

Example 36 includes the subject matter of any of Examples 28-35, and wherein the gate comprises ruthenium, iridium, platinum, palladium, molybdenum, rhodium, rhenium, or tungsten.

Example 37 includes the subject matter of any of Examples 28-36, and wherein epitaxially depositing the ferroelectric layer comprises epitaxially depositing the ferroelectric layer with a time-varying dopant concentration.

Example 38 includes the subject matter of any of Examples 28-37, and wherein the first plurality of layers comprise lanthanum, barium, tin, and oxygen.

Example 39 includes the subject matter of any of Examples 28-38, and wherein the second plurality of layers comprise barium, tin, and oxygen.

Example 40 includes the subject matter of any of Examples 28-39, and wherein etching the second plurality of layers comprises exposing the first plurality of layers and the second plurality of layers to a wet etchant, wherein the wet etchant preferentially etches the second plurality of layers, wherein lanthanum in the first plurality of layers slows etching of the first plurality of layers.

Example 41 includes the subject matter of any of Examples 28-40, and wherein a density of lanthanum in the second plurality of layers is less than 10% of a density of lanthanum in the first plurality of layers.

Example 42 includes the subject matter of any of Examples 28-41, and wherein the second plurality of layers comprise a perovskite.

Example 43 includes the subject matter of any of Examples 28-42, and wherein the second plurality of layers comprise strontium, titanium, and oxygen.

Example 44 includes the subject matter of any of Examples 28-43, and wherein the second plurality of layers comprise strontium, ruthenium, and oxygen.

Example 45 includes the subject matter of any of Examples 28-44, and wherein the second plurality of layers comprise strontium, barium, ruthenium, and oxygen.

Example 46 includes the subject matter of any of Examples 28-45, and wherein the second plurality of layers comprise lanthanum, lutetium, and oxygen.

Example 47 includes the subject matter of any of Examples 28-46, and wherein the second plurality of layers comprise lanthanum, lutetium, scandium, and oxygen.

Example 48 includes the subject matter of any of Examples 28-47, and wherein the second plurality of layers comprise barium, scandium, niobium, and oxygen.

Example 49 includes the subject matter of any of Examples 28-48, and wherein the first plurality of layers are a doped semiconductor and the second plurality of layers are an undoped semiconductor.

Example 50 includes the subject matter of any of Examples 28-49, and wherein a lattice constant of the ferroelectric layer is within 3% of a lattice constant of the plurality of fins.

Example 51 includes the subject matter of any of Examples 28-50, and wherein a lattice constant of the second plurality of layers is within 3% of a lattice constant of the first plurality of layers.

Example 52 includes the subject matter of any of Examples 28-51, and wherein the ferroelectric layer comprises barium, titanium, and oxygen.

Example 53 includes the subject matter of any of Examples 28-52, and wherein the ferroelectric layer comprises bismuth, iron, and oxygen.

Example 54 includes a device comprising a ribbon field effect transistor (FET) comprising a plurality of channel fins; a ferroelectric layer, wherein the ferroelectric layer is conformal to the plurality of channel fins, wherein the ferroelectric layer is lattice matched to the plurality of channel fins; and a gate layer, wherein the gate layer is conformal to the ferroelectric layer.

Example 55 includes the subject matter of Example 54, and wherein the plurality of channel fins comprise lanthanum, barium, tin, and oxygen.

Example 56 includes the subject matter of any of Examples 54 and 55, and wherein, at a cross-section of the FET, the gate layer surrounds individual channel fins of the plurality of channel fins.

Example 57 includes the subject matter of any of Examples 54-56, and wherein, at a cross-section of the FET, the gate layer is above and below individual channel fins of the plurality of channel fins.

Example 58 includes the subject matter of any of Examples 54-57, and wherein the plurality of channel fins are a perovskite.

Example 59 includes the subject matter of any of Examples 54-58, and wherein the ferroelectric layer is a perovskite.

Example 60 includes the subject matter of any of Examples 54-59, and wherein the gate layer is a perovskite.

Example 61 includes the subject matter of any of Examples 54-60, and wherein the gate layer comprises ruthenium, iridium, platinum, palladium, molybdenum, rhodium, rhenium, or tungsten.

Example 62 includes the subject matter of any of Examples 54-61, and wherein a lattice constant of the ferroelectric layer is within 3% of a lattice constant of the plurality of channel fins.

Example 63 includes the subject matter of any of Examples 54-62, and wherein the ferroelectric layer comprises barium, titanium, and oxygen.

Example 64 includes the subject matter of any of Examples 54-63, and wherein the ferroelectric layer comprises bismuth, iron, and oxygen.

Example 65 includes a processor comprising the device of any of Examples 54-64.

Example 66 includes a system comprising the processor of Example 65 and one or more memory devices.

The invention claimed is:

1. A device comprising:

a substrate;

a first dielectric isolation layer adjacent the substrate;

a second dielectric isolation layer adjacent the substrate;

a plurality of fins, wherein the plurality of fins are disposed between the first dielectric isolation layer and the second dielectric isolation layer, wherein the plurality of fins are a perovskite;

a ferroelectric layer, wherein the ferroelectric layer is conformal to the plurality of fins, the first dielectric isolation layer, and the second dielectric isolation layer; and a gate layer, wherein the gate layer is conformal to the ferroelectric layer.

2. The device of claim 1, wherein the plurality of fins comprise lanthanum, barium, tin, and oxygen.

3. The device of claim 1, wherein, at a cross-section of the device, the gate layer surrounds individual fins of the plurality of fins.

4. The device of claim 1, wherein, at a cross-section of the device, the gate layer is above and below individual fins of the plurality of fins.

5. The device of claim 1, wherein the ferroelectric layer is a perovskite.

6. The device of claim 1, wherein the gate layer is a perovskite.

7. The device of claim 1, wherein the gate layer comprises ruthenium, iridium, platinum, palladium, molybdenum, rhodium, rhenium, or tungsten.

8. The device of claim 1, wherein the first dielectric isolation layer comprises silicon and nitrogen, wherein the second dielectric isolation layer comprises silicon and nitrogen.

9. The device of claim 1, wherein a lattice constant of the ferroelectric layer is within 3% of a lattice constant of the plurality of fins.

10. The device of claim 1, wherein the ferroelectric layer comprises barium, titanium, and oxygen.

11. The device of claim 1, wherein the ferroelectric layer comprises bismuth, iron, and oxygen.

12. A processor comprising the device of claim 1.

13. A system comprising the processor of claim 12 and one or more memory devices.

14. A device comprising:
- a ribbon field effect transistor (FET) comprising:
  - a plurality of channel fins;
  - a ferroelectric layer, wherein the ferroelectric layer is conformal to the plurality of channel fins, wherein the ferroelectric layer is lattice matched to the plurality of channel fins; and
  - a gate layer, wherein the gate layer is conformal to the ferroelectric layer.

15. The device of claim 14, wherein the plurality of channel fins comprise lanthanum, barium, tin, and oxygen.

16. The device of claim 14, wherein a lattice constant of the ferroelectric layer is within 3% of a lattice constant of the plurality of channel fins.

17. The device of claim 14, wherein the ferroelectric layer comprises barium, titanium, and oxygen.

18. A device comprising:
- a ribbon field effect transistor (FET) comprising:
  - a substrate;
  - first and second dielectric isolation layers disposed on the substrate;
  - a plurality of channel fins disposed between the first and second dielectric isolation layers;
  - dielectric spacers disposed at opposing ends of the plurality of channel fins, wherein the dielectric spacers together with the first and second dielectric isolation layers define a cavity that surrounds the plurality of channel fins;
  - a ferroelectric layer lining the cavity, wherein the ferroelectric layer is conformal to surfaces of the plurality of channel fins and to interior surfaces of the first and second dielectric isolation layers and the dielectric spacers; and
  - a gate layer disposed on the ferroelectric layer within the cavity, wherein the gate layer is conformal to the ferroelectric layer.

19. The device of claim 18, wherein, at a cross-section of the ribbon FET, the gate layer surrounds individual channel fins of the plurality of channel fins.

20. The device of claim 18, wherein the first dielectric isolation layer comprises silicon and nitrogen and the second dielectric isolation layer comprises silicon and nitrogen.

21. The device of claim 18, wherein the plurality of channel fins are a perovskite.

22. The device of claim 21, wherein the plurality of channel fins comprise lanthanum, barium, tin, and oxygen.

23. The device of claim 18, wherein the ferroelectric layer comprises barium, titanium, and oxygen, or wherein the ferroelectric layer comprises bismuth, iron, and oxygen.

24. The device of claim 18, wherein a dopant concentration of the ferroelectric layer varies through a thickness of the ferroelectric layer.

* * * * *